(12) United States Patent
Kaneko et al.

(10) Patent No.: US 12,689,004 B2
(45) Date of Patent: Jul. 21, 2026

(54) PLASMA PROCESSING APPARATUS

(71) Applicants: Tokyo Electron Limited, Tokyo (JP);
The University of Shiga Prefecture,
Shiga (JP)

(72) Inventors: Kazushi Kaneko, Yamanashi (JP);
Osamu Sakai, Shiga (JP)

(73) Assignees: Tokyo Electron Limited, Tokyo (JP);
The University of Shiga Prefecture,
Shiga (JP)

( * ) Notice: Subject to any disclaimer, the term of this
patent is extended or adjusted under 35
U.S.C. 154(b) by 104 days.

(21) Appl. No.: 18/622,596

(22) Filed: Mar. 29, 2024

(65) Prior Publication Data

US 2024/0339300 A1      Oct. 10, 2024

(30) Foreign Application Priority Data

Apr. 4, 2023      (JP) ................................. 2023-060577

(51) Int. Cl.
H01J 37/32          (2006.01)
(52) U.S. Cl.
CPC .... H01J 37/32247 (2013.01); H01J 37/3222
(2013.01); H01J 37/32238 (2013.01); *H01J*
*2237/327* (2013.01)
(58) Field of Classification Search
None
See application file for complete search history.

(56) References Cited

U.S. PATENT DOCUMENTS

| | | | | | |
|---|---|---|---|---|---|
| 5,134,965 | A | * | 8/1992 | Tokuda | H01J 37/32192 |
| | | | | | 204/298.31 |
| 5,225,740 | A | * | 7/1993 | Ohkawa | H05H 1/46 |
| | | | | | 315/111.41 |
| 5,304,282 | A | * | 4/1994 | Flamm | H01J 37/32247 |
| | | | | | 427/551 |
| 5,902,404 | A | * | 5/1999 | Fong | H05H 1/46 |
| | | | | | 156/345.36 |
| 10,546,725 | B2 | * | 1/2020 | Hirano | H01J 37/32192 |
| 10,777,389 | B2 | * | 9/2020 | Ikeda | H01J 37/32467 |

(Continued)

FOREIGN PATENT DOCUMENTS

| | | |
|---|---|---|
| JP | 2009-245593 A | 10/2009 |
| KR | 10-0800396 B1 | 2/2008 |
| KR | 10-2017-0096960 A | 8/2017 |

*Primary Examiner* — Srinivas Sathiraju
(74) *Attorney, Agent, or Firm* — Fenwick & West LLP

(57) ABSTRACT

A plasma processing apparatus comprises a processing
chamber having a processing space, an electromagnetic
wave generator configured to generate electromagnetic
waves for plasma excitation to be supplied to the processing
space, a dielectric having a first surface facing the process-
ing space, an electromagnetic wave supply configured to
supply the electromagnetic waves to the processing space
via the dielectric, and a resonator array structure disposed
along the first surface of the dielectric in the processing
chamber. The resonator array structure includes a plurality
of resonators resonating with magnetic field components of
the electromagnetic waves, having a size smaller than a
wavelength of the electromagnetic waves, and arranged in a
direction along the first surface of the dielectric. The elec-
tromagnetic wave supply is configured to supply magnetic
field components perpendicular to a plane on which the
plurality of resonators are arranged.

18 Claims, 18 Drawing Sheets

(56)                         References Cited

U.S. PATENT DOCUMENTS

| | | | |
|---|---|---|---|
| 11,410,835 B2 * | 8/2022 | Ikeda | H01J 37/32229 |
| 11,948,776 B2 * | 4/2024 | Hsu | H01J 37/32229 |
| 12,243,716 B2 * | 3/2025 | Ikeda | H01J 37/32082 |
| 2005/0173069 A1 * | 8/2005 | Tolmachev | H01J 37/32247 156/345.36 |
| 2006/0043319 A1 * | 3/2006 | Gaebel | H05G 2/0094 250/504 R |
| 2011/0088848 A1 * | 4/2011 | Kim | H05H 1/46 118/723 MW |
| 2012/0228261 A1 * | 9/2012 | Watanabe | H10P 50/71 216/41 |
| 2017/0236690 A1 * | 8/2017 | Hirano | H01J 37/32192 156/345.41 |
| 2017/0263417 A1 * | 9/2017 | Ikeda | H01J 37/32266 |
| 2017/0263421 A1 * | 9/2017 | Ikeda | H01J 37/32266 |
| 2019/0088453 A1 * | 3/2019 | Sonoda | H01J 37/32678 |
| 2020/0294772 A1 * | 9/2020 | Hummelt | F03H 1/0093 |
| 2020/0381224 A1 * | 12/2020 | Ikeda | H01J 37/32229 |
| 2021/0193439 A1 * | 6/2021 | Uda | H01J 37/3211 |
| 2023/0187174 A1 * | 6/2023 | Tokunaga | H01J 37/32165 438/798 |
| 2024/0014010 A1 * | 1/2024 | Kawanabe | H01J 37/32247 |
| 2024/0038498 A1 * | 2/2024 | Park | H01J 37/321 |
| 2024/0339300 A1 * | 10/2024 | Kaneko | H01J 37/32247 |

* cited by examiner

PLASMA PROCESSING APPARATUS

CROSS-REFERENCE TO RELATED APPLICATIONS

This application claims priority to Japanese Patent Application No. 2023-060577 filed on Apr. 4, 2023, the entire contents of which are incorporated herein by reference.

TECHNICAL FIELD

The present disclosure relates to a plasma processing apparatus.

BACKGROUND

Japanese Laid-open Patent Publication No. 2009-245593 discloses a plasma processing apparatus for generating plasma by supplying microwaves for plasma excitation into a processing chamber.

SUMMARY

The present disclosure provides a plasma processing apparatus capable of simplifying a structure of a resonator array structure.

A plasma processing apparatus according to one embodiment of the present disclosure comprises a processing chamber having a processing space; an electromagnetic wave generator configured to generate electromagnetic waves for plasma excitation to be supplied to the processing space; a dielectric having a first surface facing the processing space; an electromagnetic wave supply configured to supply the electromagnetic waves to the processing space via the dielectric; and a resonator array structure disposed along the first surface of the dielectric in the processing chamber, wherein the resonator array structure includes a plurality of resonators resonating with magnetic field components of the electromagnetic waves, having a size smaller than a wavelength of the electromagnetic waves, and arranged in a direction along the first surface of the dielectric, and the electromagnetic wave supply is configured to supply magnetic field components perpendicular to a plane on which the plurality of resonators are arranged.

DETAILED DESCRIPTION

Hereinafter, embodiments of a plasma processing apparatus of the present disclosure will be described in detail with reference to the accompanying drawings. Further, the following embodiments are not intended to limit the present disclosure.

In a plasma processing apparatus using microwaves for plasma excitation, the power of microwaves supplied into the processing chamber may be increased in order to increase the electron density of plasma. The electron density of the plasma can be increased as the power of the microwaves supplied into the processing chamber is increased.

Here, it is known that when the electron density of the plasma reaches a certain upper limit by increasing the power of the microwaves supplied into the processing chamber, the dielectric constant of the inner space of the processing chamber becomes negative. This upper limit value of the electron density is appropriately referred to as "cutoff density." Further, the refractive index is known as an index indicating whether or not microwaves propagate in the space. The refractive index N is expressed by the following Eq. (1).

$$N = \sqrt{\varepsilon}\sqrt{\mu} \qquad \text{Eq. (1)}$$

Here, $\varepsilon$ indicates permittivity, and $\mu$ indicates magnetic permeability.

Since the magnetic permeability is generally positive, when the dielectric constant of the inner space of the processing chamber becomes negative, the refractive index of the inner space of the processing chamber becomes a pure imaginary number according to the above Eq. (1). Accordingly, the microwaves are attenuated and cannot propagate through the inner space of the processing chamber. When the electron density of the plasma reaches the cutoff density, the microwaves cannot propagate in the inner space of the processing chamber and, thus, the microwave power cannot be sufficiently absorbed by the plasma. As a result, it is difficult to increase the density of the plasma generated in the processing chamber over a wide area. Although microwaves have been described as an example, the same problems occur in a plasma processing apparatus using electromagnetic waves in very high frequency (VHF) to ultra high frequency (UHF) bands.

Therefore, there is a demand for a technique capable of increasing the plasma density over a wide range and simplifying the structure of the resonator array structure.

First Embodiment

<Configuration of Plasma Processing Apparatus>

Figure 1:
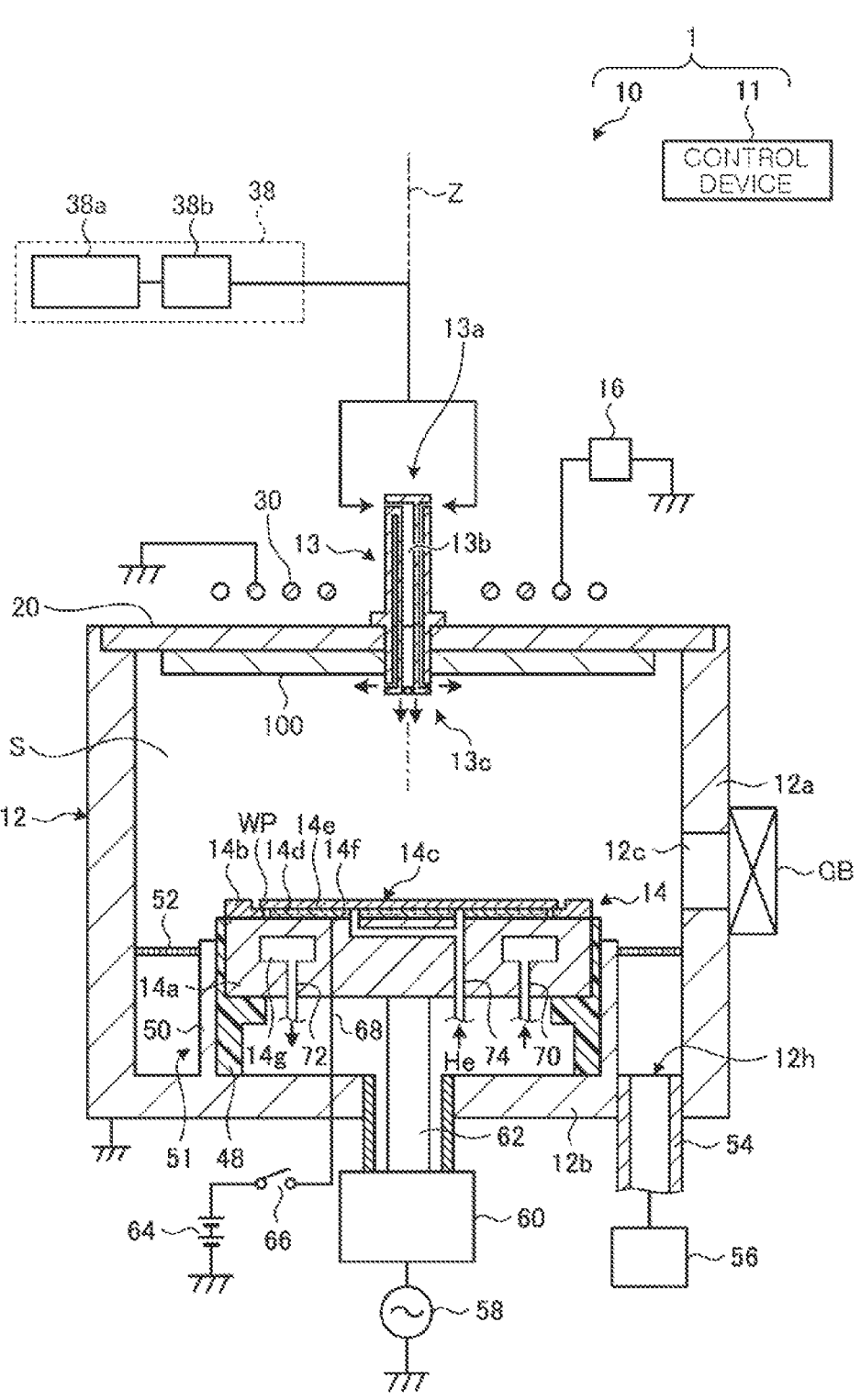
FIG. 1 is a schematic cross-sectional view showing an example of a configuration of a plasma processing apparatus according to a first embodiment.

FIG. 1 is a schematic cross-sectional view showing an example of a configuration of a plasma processing apparatus 1 according to the first embodiment. The plasma processing apparatus 1 includes an apparatus main body 10 and a control device (an example of a controller) 11. The plasma processing apparatus 1 shown in FIG. 1 is configured, e.g., as an inductively coupled plasma processing apparatus. The apparatus main body 10 includes a processing chamber 12, a stage 14, a radio frequency (RF) power supply (an example of an electromagnetic wave generator) 16, a dielectric window 20, an antenna 30, a gas supply 38, and a resonator array structure 100. The apparatus main body 10 includes a central gas injector 13. The central gas injector 13 is disposed above the stage 14, and is attached to the central opening of the dielectric window 20. The antenna 30 is disposed on or above (outside) the processing chamber 12 (the dielectric window 20).

The processing chamber 12 is formed in a substantially cylindrical shape and made of, e.g., aluminum having an anodically oxidized surface. The processing chamber 12 has therein a substantially cylindrical processing space S. The processing chamber 12 is frame grounded. Further, the processing chamber 12 has a sidewall 12a and a bottom portion 12b. The central axis of the sidewall 12a is defined as the Z-axis. The bottom portion 12b is disposed on the lower end side of the sidewall 12a. An exhaust port 12h for exhaust is disposed at the bottom portion 12b. The upper end of the sidewall 12a is opened. The inner wall surface of the sidewall 12a faces the processing space S. In other words, the sidewall 12a has an inner wall surface facing the processing space S.

An opening 12c for loading/unloading an object to be processed WP is formed in the sidewall 12a. The opening 12c is opened and closed by a gate valve GB.

A dielectric window 20 is disposed at the upper end of the sidewall 12a, and closes the opening formed at the upper end of the sidewall 12a from the top. A bottom surface (an example of a first surface) 20a of the dielectric window (an example of a dielectric) 20 faces the processing space S. In other words, the dielectric window 20 has the bottom surface 20a facing the processing space S.

The stage 14 is disposed in the processing chamber 12. The stage 14 is disposed to face the dielectric window 20 in the Z-axis direction. The space between the stage 14 and the dielectric window 20 serves as the processing space S. The object to be processed WP is placed on the stage 14.

The stage 14 has a base 14a and an electrostatic chuck 14c. The base 14a is made of a conductive material such as aluminum, and has a substantially disc shape. The base 14a is disposed in the processing chamber 12 such that the central axis of the base 14a substantially coincides with the Z-axis.

The base 14a is supported by a cylindrical support 48 made of an insulating material and extending in the Z-axis direction. A conductive cylindrical support 50 is disposed at the outer periphery of the cylindrical support 48. The cylindrical support 50 extends from the bottom portion 12b of the processing chamber 12 toward the dielectric window 20 along the outer periphery of the cylindrical support 48. An annular exhaust path 51 is formed between the cylindrical support 50 and the sidewall 12a.

An annular baffle plate 52 having a plurality of through-holes formed in a thickness direction is disposed above the exhaust path 51. The above-described exhaust port 12h is disposed below the baffle plate 52. An exhaust device 56 having a vacuum pump such as a turbo molecular pump, an automatic pressure control valve, or the like is connected to the exhaust port 12h through an exhaust line 54. The exhaust device 56 can reduce a pressure in the processing space S to a desired vacuum level.

The base 14a functions as a radio frequency (RF) electrode. An RF power supply 58 for RF bias is electrically connected to the base 14a via a power supply rod 62 and a matching unit 60. The RF power supply 58 supplies a bias power of a predetermined frequency (e.g., 13.56 MHz) suitable for controlling the energy of ions attracted to the object to be processed WP to the base 14a via the matching unit 60 and the power supply rod 62.

The matching unit 60 accommodates a matching box for matching the impedance on the RF power supply 58 side and the impedance on the load side, mainly the electrode, the plasma, and the processing chamber 12. The matching box includes a blocking capacitor for self-bias generation.

The electrostatic chuck 14c is disposed on the upper surface of the base 14a. The electrostatic chuck 14c attracts and holds the object WP to be processed using an electrostatic force. The electrostatic chuck 14c has a substantially disc-shaped outer shape, and includes an electrode 14d, and insulating films (dielectric films) 14e and 14f. The electrostatic chuck 14c is disposed on the upper surface of the base 14a such that the center axis of the electrostatic chuck 14c substantially coincides with the Z-axis. The electrode 14d of the electrostatic chuck 14c is made of a conductive film, and is disposed between the insulating film 14e and the insulating film 14f. A DC power supply 64 is electrically connected to the electrode 14d via a coated wire 68 and a switch 66. The electrostatic chuck 14c can attract and hold the object to be processed WP on the upper surface thereof by the electrostatic force generated by a DC voltage applied from the DC power supply 64. The upper surface of the electrostatic chuck 14c serves as a placing surface on which the object to be processed WP is placed, and faces the processing space S. In other words, the electrostatic chuck 14c has the upper surface, which is the placing surface, facing the processing space S. Further, an edge ring 14b is disposed on the base 14a. The edge ring 14b is disposed to surround the object to be processed WP and the electrostatic chuck 14c. The edge ring 14b may be referred to as "focus ring."

A channel 14g is formed in the base 14a. A coolant is supplied to the channel 14g from a chiller unit (not shown) through a line 70. The coolant supplied to the channel 14g is returned to the chiller unit through a line 72. The temperature of the base 14a is controlled by circulating the coolant whose temperature is controlled by the chiller unit in the channel 14g of the base 14a. By controlling the temperature of the base 14a, the temperature of the object WP on the electrostatic chuck 14c is controlled via the electrostatic chuck 14c on the base 14a.

Further, a line 74 for supplying a heat transfer gas such as He gas to the gap between the upper surface of the electrostatic chuck 14c and the backside of the object to be processed WP is formed in the stage 14.

The RF power supply 16 is connected to the antenna 30, and is configured to generate a source RF signal (source RF power) for plasma generation via at least one impedance matching circuit. In one embodiment, the source RF signal has a frequency within a range of 10 MHz to 3000 MHz. In one embodiment, the RF power supply 16 may be configured to generate multiple source RF signals having different frequencies. The generated one or multiple source RF signals are supplied to the antenna 30. The RF power supply 16 is an example of an electromagnetic wave generator as described above, and is an example of a high frequency power supply. Further, the antenna 30 is an example of an electromagnetic wave supply.

The antenna 30 includes one or more coils. In one embodiment, the antenna 30 may include an outer coil and an inner coil that are coaxially arranged. In this case, the RF power supply 16 may be connected to both the outer coil and the inner coil, or may be connected to any one of the outer coil and the inner coil. In the former case, the same RF generator in the RF power supply 16 may be connected to both the outer coil and the inner coil, or separate RF generators may be separately connected to the outer coil and the inner coil. In one embodiment, the antenna 30 is a planar coil formed in a substantially circular spiral shape (planar spiral shape). In other words, the antenna 30 is wound in a loop shape. Further, the magnetic field generated by the antenna 30 is directed in the Z-axis direction. Further, the opening of the antenna 30 may have any shape such as a circular shape, an elliptical shape, a polygonal (quadrilateral, triangular, or the like) shape.

Further, when the antenna 30 includes the outer coil and the inner coil, the outer coil functions as a primary coil connected to the RF power supply 16. In one embodiment, the outer coil is a planar coil, and is formed in a substantially circular spiral shape. The inner coil functions as a secondary coil inductively coupled to the primary coil. In other words, the inner coil is not connected to the RF power supply 16. In one embodiment, the inner coil is a planar coil, and is formed in a substantially circular ring shape. In one embodiment, the inner coil is connected to a variable capacitor, and the direction or the magnitude of the current flowing through the inner coil is controlled by controlling the capacitance of the variable capacitor. The outer coil and the inner coil may be located at the same height, or may be located at different heights. In one embodiment, the inner coil is positioned lower than the outer coil.

The gas introducing part is configured to introduce at least one processing gas from the gas supply 38 into the processing space S. In one embodiment, the gas introducing part includes a center gas injector (CGI) 13. The central gas injector 13 is disposed above the stage 14, and is attached to a central opening formed in the dielectric window 20. The central gas injector 13 has at least one gas supply port 13a, at least one gas flow path 13b, and at least one gas inlet port 13c. The processing gas supplied to the gas supply port 13a is introduced into the processing space S from the gas inlet port 13c while passing through the gas flow path 13b, and is excited by electromagnetic waves supplied to the processing space S from the antenna 30 through the dielectric window 20 and the resonator array structure 100. Accordingly, the processing gas is turned into plasma in the processing space S, and the object to be processed WP is processed by ions, radicals, and the like contained in the plasma. The gas introducing part may include, in addition to or instead of the central gas injector 13, one or more side gas injectors (SGI) attached to one or more openings formed in the sidewall 12a.

The gas supply 38 may include at least one gas source 38a and at least one flow rate controller 38b. In one embodiment, the gas supply 38 is configured to supply at least one processing gas from a corresponding gas source 38a to the gas introducing part via a corresponding flow rate controller 38b. The flow rate controllers 38b may include, for example, a mass flow controller or a pressure-controlled flow rate controller. Further, the gas supply 38 may include one or more flow modulation devices for modulating the flow rate of at least one processing gas or causing it to pulsate.

The resonator array structure 100 is formed by arranging a plurality of resonators capable of resonating with magnetic field components of the microwaves and having a size smaller than the wavelength of the microwaves. The resonator array structure 100 is disposed in the processing chamber 12.

Since the resonator array structure 100 is disposed in the processing chamber 12, the microwaves supplied to the processing space S by each antenna 30 can resonate with the plurality of resonators of the resonator array structure 100. Due to the resonance between the microwaves and the plurality of resonators, the microwaves can be efficiently supplied to the processing space S of the processing chamber 12, and the magnetic permeability of the processing space S can become negative. When the magnetic permeability of the processing space S is negative, even if the electron density of the plasma generated in the processing space S reaches the cutoff density and the permittivity of the processing space S is negative, the refractive index is a real number according to the above Eq. (1) and, thus, the microwaves can propagate in the processing space S. Accordingly, even if the electron density of the plasma generated in the processing space S reaches the cutoff density, the microwaves can propagate beyond the skin depth of the plasma, and the microwave power is efficiently absorbed by the plasma. As a result, it is possible to generate high-density plasma over a wide range beyond the plasma skin depth. In other word, in the plasma processing apparatus 1 of the present embodiment, the plasma density can be increased over a wide range by locating the resonator array structure 100 in the processing chamber 12.

Figure 2:
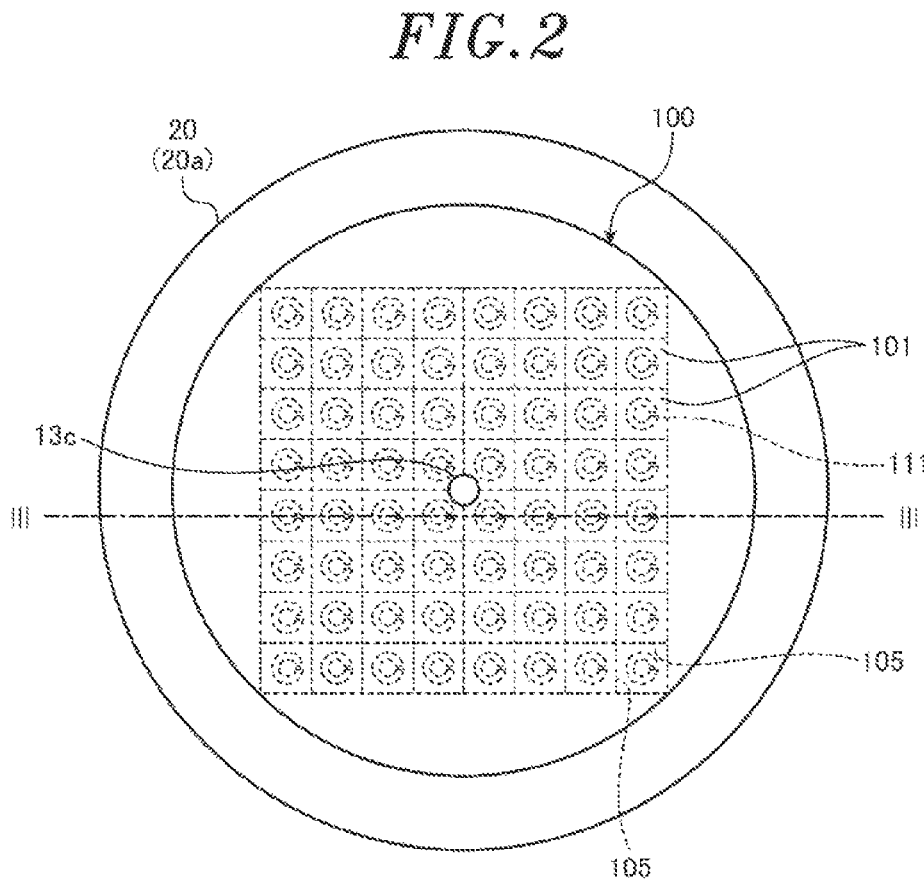
FIG. 2 is a bottom plan view showing an example of a configuration of a dielectric window and a resonator array structure according to the first embodiment.

Here, the specific configuration of the resonator array structure 100 will be described with reference to FIGS. 1 and 2. FIG. 2 is a bottom plan view showing an example of the configuration of the dielectric window and the resonator array structure according to the first embodiment. In FIG. 2, the bottom surface 20a of the dielectric window 20 has a disc shape.

As shown in FIGS. 1 and 2, the resonator array structure 100 is disposed along the bottom surface 20a of the dielectric window 20.

The resonator array structure 100 is formed by arranging a plurality of resonators 101, which can resonate with the magnetic field components of the electromagnetic waves and have a size smaller than the wavelength of the electromagnetic waves, in a grid shape. Specifically, as shown in FIG. 2, in the flat resonator array structure 100, the plurality of resonators 101 are arranged in a direction along the bottom surface 20a of the dielectric window 20 (a direction along the plane parallel to the bottom surface 20a). In other words, when viewed from the bottom surface 20a side, the C-shaped ring members 111 are arranged in a grid shape so that the C shape can be seen. In the resonator array structure 100, for example, the resonators 101 are arranged in 8 rows and 8 columns. In this case, the boundaries between the plurality of resonators 101 are shown as boundaries 105. However, actually, the plurality of resonators 101 are integrally formed as the resonator array structure 100. The resonator array structure 100 may be obtained by fitting the plurality of separate resonators 101 into a grid-shaped frame or bonding them to each other. Each of the plurality of resonators 101 constitutes a series resonant circuit including a capacitor equivalent element and a coil equivalent element. A series resonant circuit is realized by patterning a conductor on a plane. The gas inlet 13c is disposed at the center of the resonator array structure 100. Further, the magnetic field generated by the antenna 30 penetrates through the C-shaped ring members 111.

Figure 3:
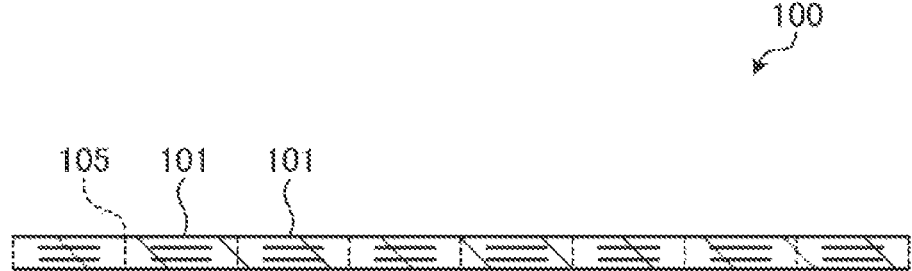
FIG. 3 is a cross-sectional view showing an example of an III-III cross section of FIG. 2.

FIG. 3 is a cross-sectional view showing an example of an III-III cross section of FIG. 2. As shown in FIG. 3, in the III-III cross section of the resonator array structure 100, the cross sections of the plurality of resonators 101 are illustrated side by side. Further, similarly to FIG. 2, the boundaries between the plurality of resonators 101 are shown as the boundaries 105.

Figure 4:
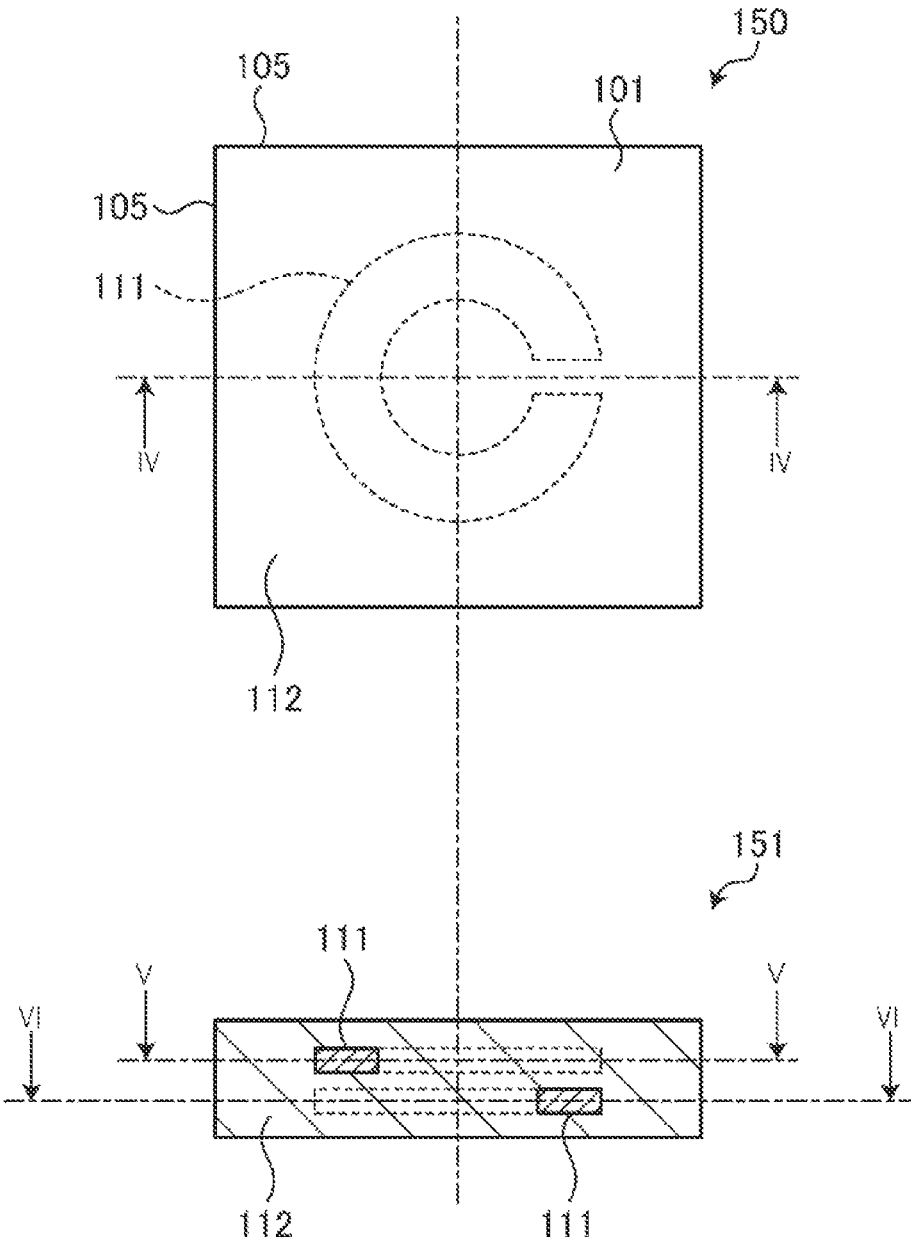
FIG. 4 shows an example of a plane and a IV-IV cross section of a single resonator according to the first embodiment.

FIG. 4 shows an example of a plane and a IV-IV cross section of a single resonator according to the first embodiment. FIG. 4 shows a plan view 150 of a single resonator 101 and a cross-sectional view 151 of the IV-IV cross section of the plan view 150 among the plurality of resonators 101 that are formed integrally. As shown in the plan view 150 and the cross-sectional view 151, the single resonator 101 is disposed in a region surrounded by the boundaries 105. In other words, in the present embodiment, in the resonator 101, the two C-shaped ring members 111 are surrounded by a dielectric 112.

Figure 5:
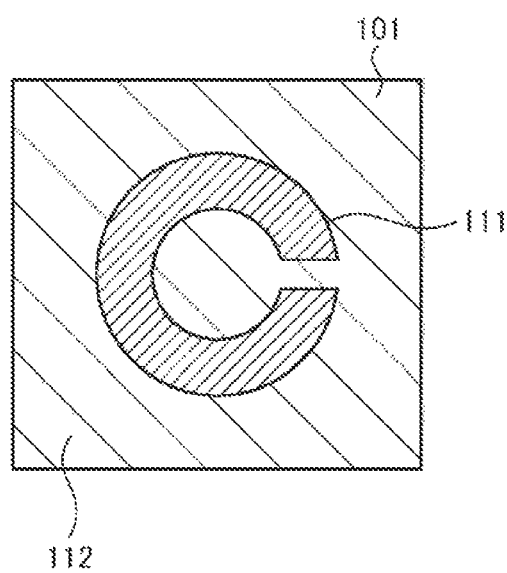
FIG. 5 is a cross-sectional view showing an example of a V-V cross section of FIG. 4.
Figure 6:
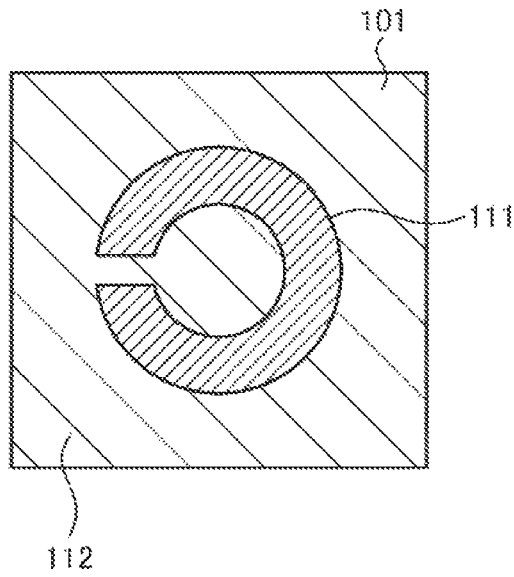
FIG. 6 is a cross-sectional view showing an example of a VI-VI cross section of FIG. 4.

FIG. 5 is a cross-sectional view showing an example of a V-V cross section of FIG. 4. FIG. 6 is a cross sectional view showing an example of a VI-VI section of FIG. 4. As shown in the cross-sectional view 151 of FIG. 4, and FIGS. 5 and 6, the single resonator 101 has a structure in which a dielectric 112 is disposed between the two C-shaped ring members 111 made of a conductor and adjacent to each other in opposite directions. In other words, in the resonator 101, the dielectric 112 is embedded between the two C-shaped ring members 111 arranged in the opposite directions. A capacitor equivalent element is formed on the opposing surfaces of the two C-shaped ring members 111 or at both ends of each ring member 111, and a coil equivalent element is formed along each ring member 111. Accordingly, the resonator 101 can constitute a series resonant circuit. In the resonator 101 shown in FIGS. 4 to 6, the number of arrangement (hereinafter, also referred to as "the number of lamination") of the C-shaped ring members 111 is two. However, the number of arrangement of the C-shaped ring members 111 may be greater than two. In this case, the resonator 101 has a structure in which the C-shaped ring members 111 are arranged adjacent to each other in the opposite directions and the dielectric 112 is embedded between the C-shaped ring members 111.

Figure 7:
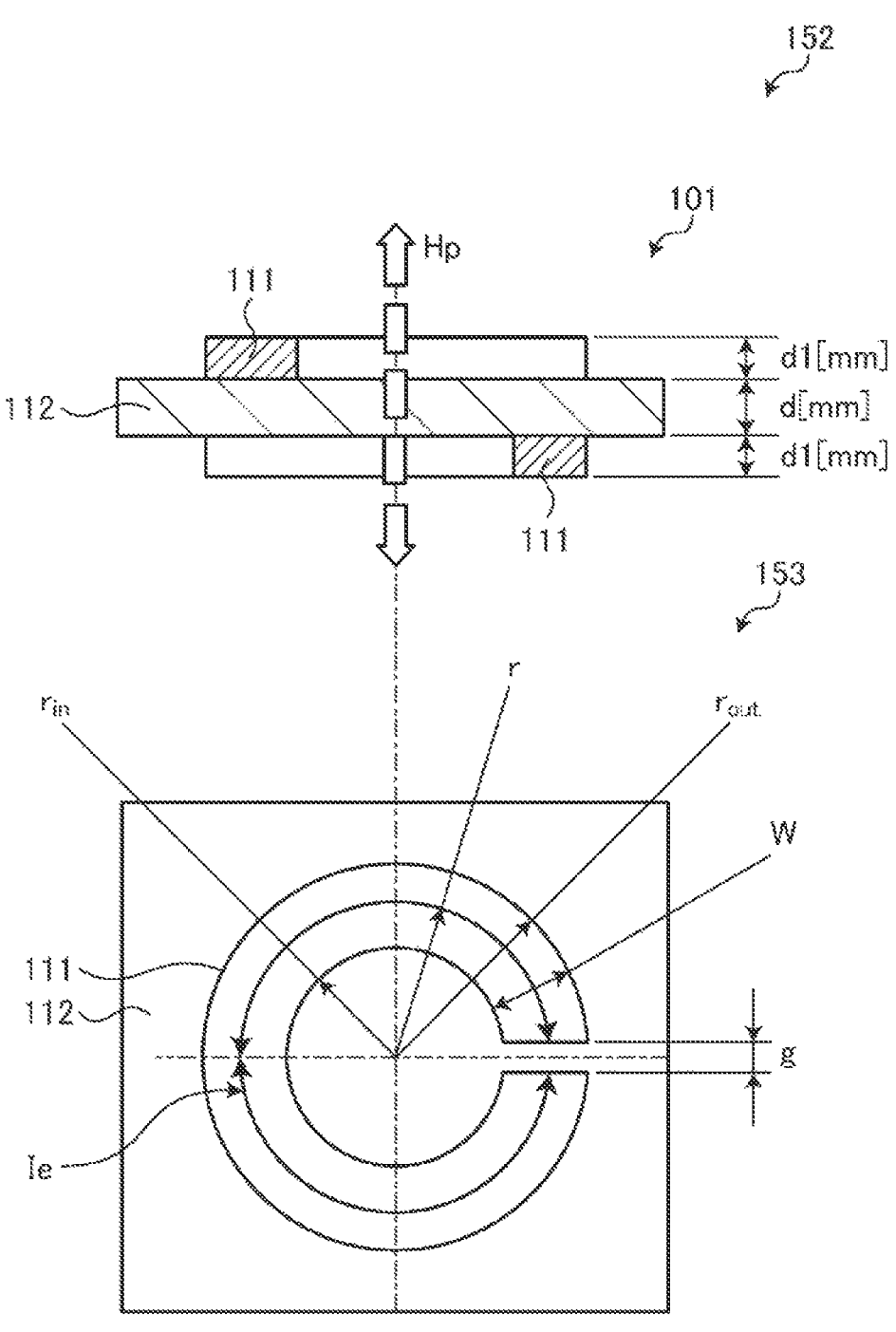
FIG. 7 is an explanatory diagram showing an example of a resonance frequency of a resonator according to the first embodiment.

Here, the resonance frequency of the resonator 101 will be described with reference to FIG. 7. FIG. 7 is an explanatory diagram showing an example of the resonance frequency of the resonator according to the first embodiment. As shown in the cross-sectional view 152 of FIG. 7, the resonator 101 has a structure in which the dielectric 112 is embedded between the two C-shaped ring members 111. In this case, when magnetic field Hp penetrating through the C-shaped ring members 111 of the resonator 101 is generated, an induced current Ie is generated at the C-shaped ring members 111. In FIG. 7, the dielectric 112 surrounding the outer sides of the C-shaped ring members 111 is omitted.

On the other hand, the resonance frequency of the resonator 101 is determined from dimensions in the cross-sectional view 152 and the plan view 153 of FIG. 7. In other words, the resonance frequency of the resonator 101 can be determined from the dimensions of the C-shaped ring members 111B and the thickness of the dielectric 112 embedded between the two C-shaped ring members 111B, as can be seen from the following Eqs. (2) to (5). Eq. (2) is an equation for determining an inductance $L_{MA}$ of the resonator 101. Eq. (3) is an equation for calculating a capacitance $C_{half}$ corresponding to an upper half or a lower half of the plan view 153 in the capacitance CMA of the resonator 101. Eq. (4) is an equation for determining a capacitance CMA of the resonator 101. Eq. (5) is an equation for determining the resonance frequency Fr of the resonator 101.

$$L_{MA} = \mu_0 r(\log(4\pi) - 1) \tag{2}$$

$$C_{half} = \varepsilon\varepsilon_0 \frac{S}{d} = \varepsilon\varepsilon_0 \frac{\left(\pi\left(r_{out}^2 - r_{in}^2\right) - S_{split}\right)/2}{d_{PTFE}} \tag{3}$$

$$C_{MA} = \frac{1}{\dfrac{1}{C_{half}} + \dfrac{1}{C_{half}}} \tag{4}$$

$$Fr = \frac{1}{2\pi\sqrt{L_{MA}C_{MA}}} \tag{5}$$

In Eq. (2), r indicates the radius from the center of the C-shaped ring member 111 to the center of the width of the C shape, and $\mu_0$ indicates the magnetic permeability of vacuum. In Eq. (3), $C_{half}$ represents the capacitance corresponding to the upper half or the lower half in the plan view 153 among the capacitance of the resonator 101. Further, in Eq. (3), $\varepsilon$ indicates the dielectric constant, $\varepsilon_0$ indicates the permittivity of vacuum (electric constant), S indicates the area of the upper half or the lower half of the C-shaped ring member 111, and d indicates the gap between the two C-shaped ring members 111. Further, in Eq. (3), $r_{out}$ indicates the outer radius of the C-shaped ring member 111, $r_{in}$ indicates the inner radius of the C-shaped ring member 111, and $S_{split}$ indicates the area of the C-shaped gap of the C-shaped ring member 111B. Further, $S_{split}$ is approximately determined as the area of a rectangle from the width W of the C-shaped ring member 111 and the C-shaped gap g shown in the plan view 153. Further, in Eq. (3), $d_{PTFE}$ indicates the gap between the two C-shaped ring members 111 in the case of using polytetrafluoroethylene (PTFE) for the dielectric 112. As shown in the cross section 125, thicknesses d1 of the two C-shaped ring members 111 are preferably the same.

In Eq. (5), the resonance frequency Fr of the resonator 101 is determined based on the inductance $L_{MA}$ and the capacitance CMA obtained by Eqs. (2) and (4). Further, the resonance frequency Fr decreases as the outer radius $r_{out}$ and the inner radius $r_{in}$ of the C-shaped ring member 111 increase, and decreases as the thickness d of the dielectric 112 embedded between the two C-shaped ring member 111 decreases. Further, the resonance frequency Fr decreases as the number of lamination of the C-shaped ring members 111 increases. Further, as will be described later, by adjusting the outer radius $r_{out}$ and the inner radius $r_{in}$ of the ring member 111 or the thickness d of the dielectric 112, the resonators 101 and 102 having different first resonance frequencies may be used. In the present embodiment, the C-shaped ring member 111 is described as a circular ring having a notch, but the present disclosure is not limited thereto. The ring member does not necessarily have a circular ring shape, and may have a shape in which any one of an elliptical ring, a triangular ring, a quadrilateral ring, and a polygonal ring has a notch (corresponding to the gap g).

As described above, in the resonator array structure 100 of the present embodiment, the plurality of resonators 101 are arranged in a direction along the bottom surface 20a of the dielectric window 20, the magnetic field Hp can penetrate through the C-shaped ring members 111 of the resonator 101 to apply magnetic field resonance. Therefore, each resonator 101 of the resonator array structure 100 can resonate at the resonance frequency Fr.

Referring back FIG. 1, the control device 11 has a processor, a memory, and an input/output interface. The memory stores programs, process recipes, and the like. The processor reads a program from the memory and executes it, thereby collectively controlling individual components of the apparatus main body 10 via the input/output interface based on the process recipe stored in the memory.

When plasma is generated in the processing space S, for example, the control device 11 controls the microwaves supplied to the processing space S by the antenna 40 and the plurality of resonators 101 to resonate in a target frequency band higher than the resonance frequencies of the plurality of resonators 101. Here, the resonance frequency is, e.g., a frequency at which the transmission characteristic values (e.g., S21 value) of the plurality of resonators 101 become minimum.

When the frequency of the microwaves supplied to the processing space S by the antenna 40 is equal to the resonance frequency Fr (e.g., about 60 MHz) of the plurality of resonators 101, the S21 value of the plurality of resonators 101 becomes minimum, and the resonance between the microwaves and the plurality of resonators 101 occurs. The resonance between the microwaves and the plurality of resonators 101 is maintained even in a predetermined frequency band (e.g., about 2.4 MHz) higher than the resonance frequency Fr of the plurality of resonators 101. In a predetermined frequency band higher than the resonance frequency Fr of the plurality of resonators 101, both the dielectric constant and the magnetic permeability of the processing space S can become negative due to the resonance between the microwaves and the plurality of resonators 101, and the microwaves can propagate in the processing space S as can be seen from the above Eq. (1). The target frequency band of the present embodiment is set to a predetermined frequency band (e.g., about 2.4 MHz) higher than the resonance frequency Fr of the plurality of resonators 101. It is preferable that the target frequency band is, e.g., within 0.05 times the resonance frequency Fr of the plurality of resonators 101.

The relationship of the resonance frequency, the refractive index, the permittivity, and the magnetic permeability regarding the propagation of electromagnetic waves to multiple resonators was reported by D. R. Smith, D. C. Vier, Th. Koschny and C. M. Soukoulis in "Electromagnetic parameter retrieval from inhomogeneous metamaterials" of "PHYSICAL REVIEW E 71, 036617 (2005)."

By resonating the microwaves and the plurality of resonators 101 in a target frequency band higher than the resonance frequency Fr of the plurality of resonators 101, the microwaves can propagate beyond the skin depth of the plasma even when the electron density of the plasma reaches the cutoff density. Therefore, the microwave power can be efficiently absorbed by the plasma. As a result, it is possible to generate high-density plasma over a wide range beyond the skin depth of the plasma. In other words, in the plasma processing apparatus 1 of the present embodiment, the plasma density can be increased over a wide range by resonating the microwaves and the plurality of resonators 101 in a target frequency band higher than the resonance frequency Fr of the plurality of resonators 101. In the resonator array structure 100 of the present embodiment, the plurality of resonators 101 are arranged in a direction along the bottom surface 20a of the dielectric window 20, so that the structure of the resonator array structure 100 can be simplified. Further, since the resonator array structure 100 is in contact with the bottom surface 20a of the dielectric window 20, heat is easily dissipated, and deformation of the resonator array structure 100, such as cracks and the like, can be suppressed. Moreover, since the plurality of resonators 101 of the resonator array structure 100 are integrated, it is possible to suppress adhesion of particles to the resonator array structure 100.

Second Embodiment

In the first embodiment, a coil formed in a planar spiral shape is used as the antenna 30, and the resonator array structure 100 is disposed along the bottom surface 20a of the dielectric window 20. However, the present disclosure is not limited thereto. For example, a solenoid-shaped coil may be used as the antenna, and the resonator array structure 100 may be disposed in the processing space S to be spaced apart from the bottom surface 20a of the dielectric window 20. An embodiment in that case will be described as a second embodiment. Since the plasma processing apparatus of the second embodiment is the same as that of the first embodiment except the shape of the antenna and the arrangement of the resonator array structure 100, the description of redundant components and operations will be omitted. In the second embodiment, the positional relationship between the dielectric window 20, the antenna, the resonator array structure 100, and the stage 14 on which the object to be processed WP is placed will be mainly described, so that drawings that are simpler than FIG. 1 are used for description.

Figure 8:
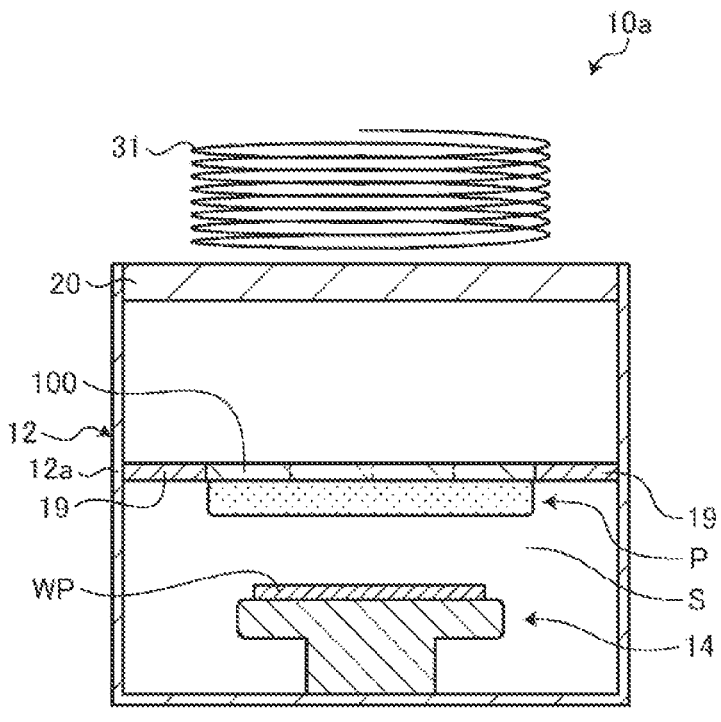
FIG. 8 is a schematic cross-sectional view showing an example of a configuration of an apparatus main body according to a second embodiment.

FIG. 8 is a schematic cross-sectional view showing an example of a configuration of an apparatus main body according to the second embodiment. As shown in FIG. 8, an apparatus main body 10a of the second embodiment includes an antenna 31 instead of the antenna 30 of the first embodiment. Further, the resonator array structure 100 is fixed to the sidewall 12a of the processing chamber 12 via a support member 19, and is spaced apart from the bottom surface 20a of the dielectric window 20.

The antenna 31 includes a solenoid-shaped coil. In other words, the antenna 31 is wound in a loop shape. The opening of the antenna 31 may have any shape such as a circular shape, an elliptical shape, and a polygonal (quadrilateral, triangular, or the like) shape. The antenna 31 is connected to the RF power supply 16, and receives a source RF signal. The magnetic field generated by the antenna 31 is directed in the Z-axis direction, similarly to the antenna 30 of the first embodiment.

The support member 19 is made of a non-magnetic material, and supports the resonator array structure 100. The support member 19 is made of a non-magnetic material, such as aluminum or an insulator. Further, the support member 19 has openings through which the processing gas freely passes at the upper side and the lower side of the resonator array structure 100 in the processing space S. For example, the support member 19 may be a rod-shaped member that supports two or more locations between the sidewall 12a and the side surface of the resonator array structure 100.

In the second embodiment, when the source RF signal is supplied to the antenna 31, the magnetic field passes through the dielectric window 20 and reaches the resonator array structure 100. In the resonator array structure 100, each resonator 101 resonates due to the magnetic field, and plasma P is generated at the lower part of the resonator array structure 100 as shown in FIG. 8. In other words, in the second embodiment, the plasma P can be generated at a position closer to the object to be processed WP by changing the arrangement of the resonator array structure 100. Further, in the second embodiment, the gap between the resonator array structure 100 and the object to be processed WP can be controlled by adjusting the attachment position of the support member 19 to the sidewall 12a.

Further, in the case of generating the plasma P at the lower part of the resonator array structure 100, the generation position of the plasma P can be controlled by the dimensions of the dielectric 112 surrounding the outer sides of the C-shaped ring members 111. For example, the thickness of the upper dielectric 112 disposed on the upper side (on the dielectric window 20 side) from the C-shaped ring member 111 and the thickness of the dielectric 112 disposed on the lower side (on the stage 14 side) from the C-shaped ring member 111 satisfy the relationship in which the thickness of the upper dielectric 112>the thickness is the thickness of the lower dielectric 112. Here, when the plasma P is generated in the processing space S, the C-shaped ring members 111 may serve as electrodes, and the C-shaped ring members 111 and the dielectric 112 may be considered as capacitors. In this case, the capacitor including the lower C-shaped ring member 111 has a larger capacitance and larger electrostatic energy compared to the capacitor including the upper C-shaped ring member 111 due to the smaller thickness of the dielectric 112. Hence, the plasma P is likely to be generated at the lower side (on the stage 14 side) of the resonator array structure 100. In other words, the generation position of the plasma P can be controlled by changing the dimensions of the dielectric 112 surrounding the outer sides of the C-shaped ring members 111.

Modifications 1 to 4

Figure 9:
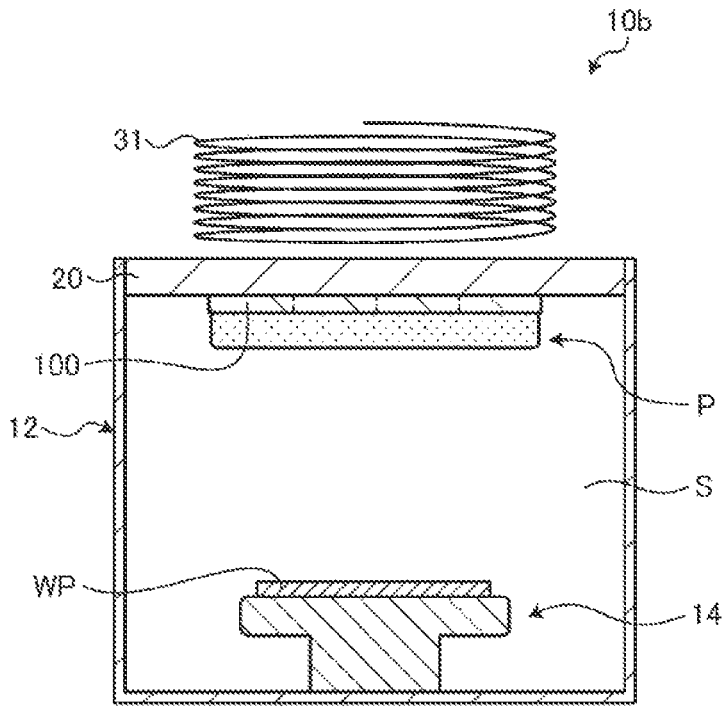
FIG. 9 is a schematic cross-sectional view showing an example of a configuration of an apparatus main body according to Modification 1.

Next, Modifications 1 to 4 of the second embodiment will be described with reference to FIGS. 9 to 12. FIG. 9 is a schematic cross-sectional view showing an example of a configuration of an apparatus main body according to Modification 1. The apparatus main body 10b shown in FIG. 9 is an example in which the resonator array structure 100 is disposed along the bottom surface 20a of the dielectric window 20 in the second embodiment. In other words, the apparatus main body 10b corresponds to the case where the antenna 31 of the second embodiment is used instead of the antenna 30 in the first embodiment. In modification example 1, the distance between the antenna 31 and the resonator array structure 100 is shorter than that in the apparatus main body 10a of the second embodiment, so that the plasma P can be efficiently generated at the lower part of the resonator array structure 100.

Figure 10:
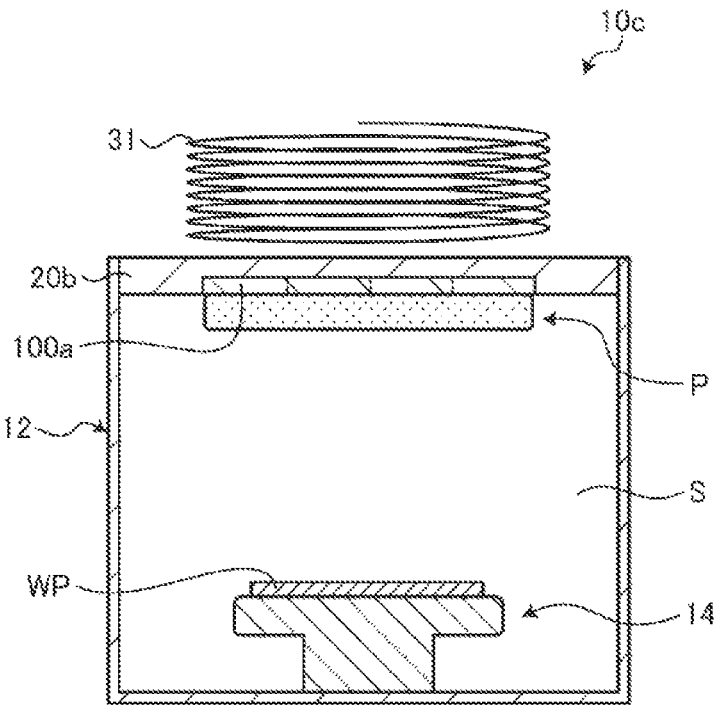
FIG. 10 is a schematic cross-sectional view showing an example of a configuration of an apparatus main body according to Modification 2.

FIG. 10 is a schematic cross-sectional view showing an example of a configuration of an apparatus main body according to Modification 2. An apparatus main body 10c shown in FIG. 10 is an example in which the resonator array structure 100 in the second embodiment is embedded, as the resonator array structure 100a, in a dielectric window 20b. In Modification 2, the distance between the antenna 31 and the resonator array structure 100a can be shorter than that in Modification 1, so that the plasma P can be more efficiently generated at the lower part of the resonator array structure 100a. Further, in Modification 2, the dielectric window 20b and the resonator array structure 100a are integrated, so that the structure of the resonator array structure 100a can be further simplified. The resonator array structure 100a may be cooled by providing a coolant channel or the like inside or outside the dielectric window 20b (on the atmosphere side).

Figure 11:
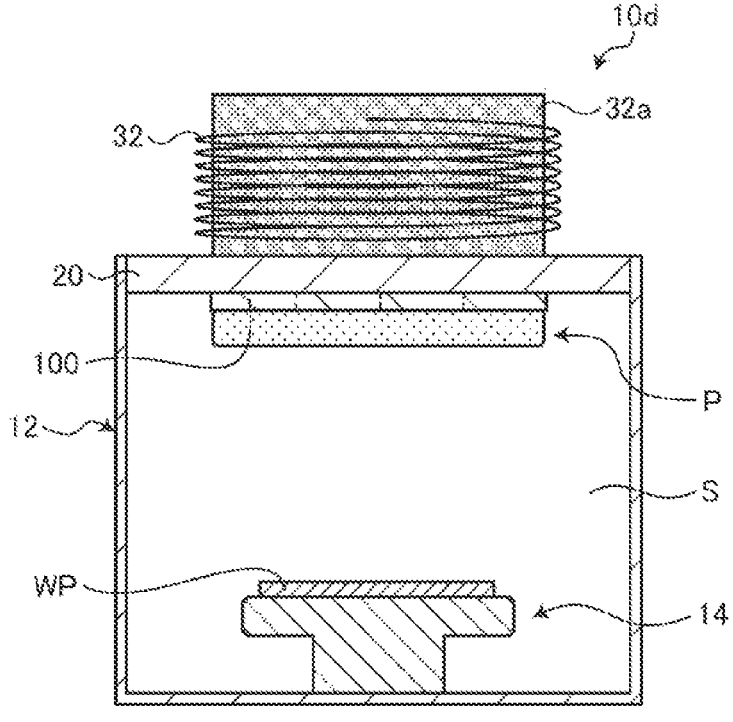
FIG. 11 is a schematic cross-sectional view showing an example of a configuration of an apparatus main body according to Modification 3.

FIG. 11 is a schematic cross-sectional view showing an example of a configuration of an apparatus main body according to Modification 3. An apparatus main body 10d shown in FIG. 11 has an antenna 32 that is a coil having a core instead of the antenna 31 of Modification 1. The antenna 32 is a solenoid-shaped coil, and a core 32a is inserted into the central portion thereof. The core 32a is, e.g., an iron core, but may be made of another material such as ferrite as long as the core is made of a high magnetic permeability material. The opening of the antenna 32 may have any shape such as a circular shape, an elliptical shape, and a polygonal (quadrilateral, triangular, or the like) shape. The antenna 32 can generate stronger magnetic field compared to the antenna 31. In other words, in Modification 3, the density of the plasma P can be improved. Further, in Modification 3, in the case of generating the same magnetic field as that in Modification 1, the antenna 32 can be scaled down.

Figure 12:
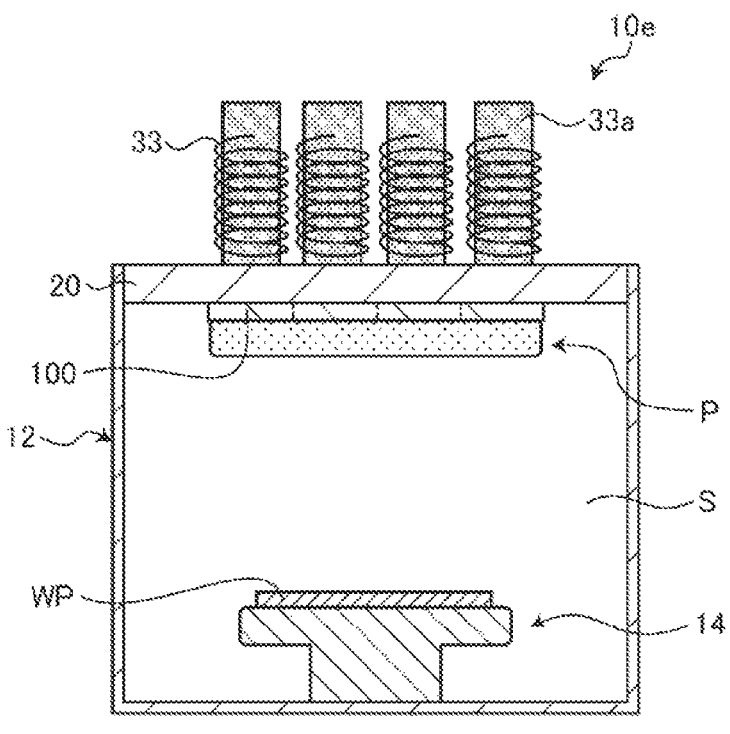
FIG. 12 is a schematic cross-sectional view showing an example of a configuration of an apparatus main body according to Modification 4.

FIG. 12 is a schematic cross-sectional view showing an example of a configuration of an apparatus main body according to Modification 4. An apparatus main body 10e shown in FIG. 12 has an antenna 33 that is a coil having multiple cores instead of the antenna 32 of Modification 3. Each antenna 33 is a solenoid-shaped coil, and a core 33a is inserted into the central portion thereof. The core 33a is, e.g., an iron core, but may be made of another material such as ferrite as long as the core is made of a high magnetic permeability material. The opening of the antenna 33 may have any shape such as a circular shape, an elliptical shape, and a polygonal (quadrilateral shape, triangular shape, or the like). Each antenna 33 is provided to correspond to each resonator 101 of the resonator array structure 100. In other words, in Modification 4, it is possible to control the plasma density of the plasma P generated directly under each resonator 101 by each antenna 33 corresponding thereto. In other words, in Modification 4, the plasma P can be controlled more precisely. The antenna 33 may be an air-core coil without the core 33*a*. Further, in the antenna 33, the plurality of resonators 101 may be provided to correspond to one antenna 33.

Third Embodiment

Although the resonator array structure 100 including the resonators 101 having the same resonance frequency has been described in the above embodiments, a resonator array structure including resonators having different resonance frequencies may be used. An embodiment in that case will be described as a third embodiment. Since a plasma processing apparatus in the third embodiment is the same as that in the above-described first embodiment except the structure of the resonator array structure 100, the description of redundant configurations and operations will be omitted.

Figure 13:
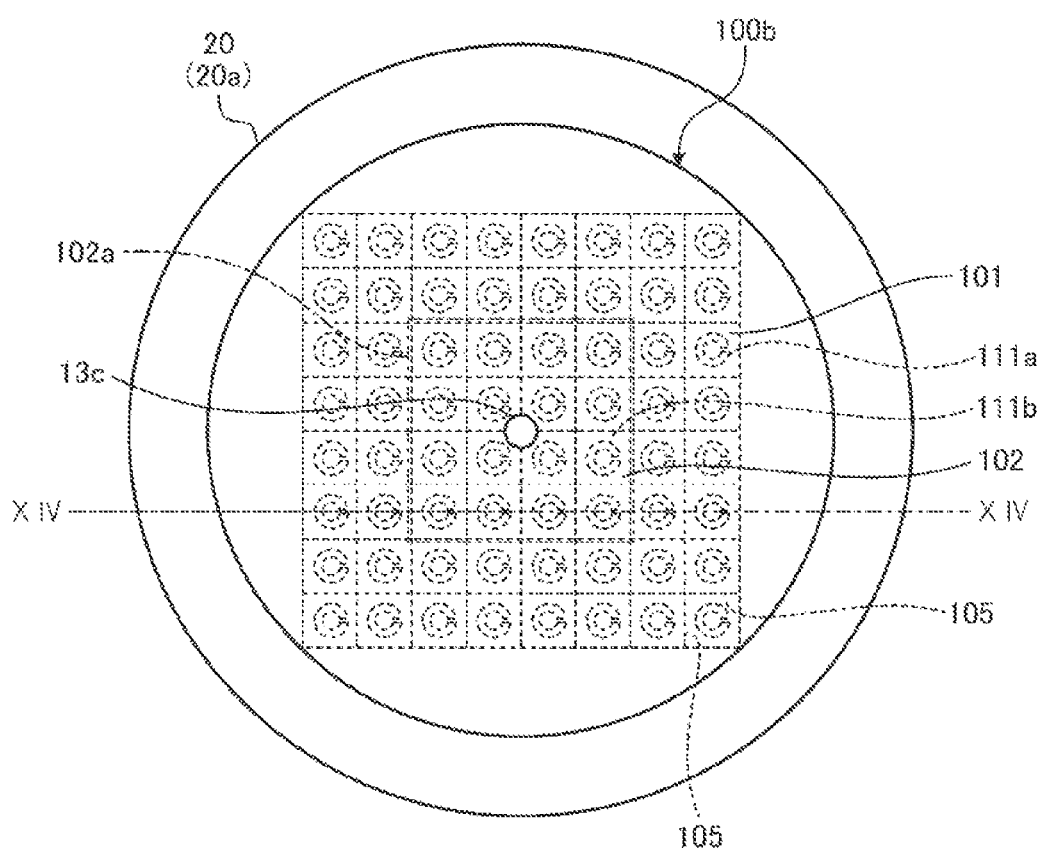
FIG. 13 is a bottom plan view showing an example of a configuration of a dielectric window and a resonator array structure according to a third embodiment.

FIG. 13 is a bottom plan view showing an example of a configuration of a dielectric window and a resonator array structure according to the third embodiment. As shown in FIG. 13, in the third embodiment, a resonator array structure 100*b* is included instead of the resonator array structure 100 of the first embodiment. As shown in FIG. 13, the resonator array structure 100*b* is formed by arranging a plurality of resonators 101 and 102, which can resonate with the magnetic field components of the electromagnetic waves and have a size smaller than the wavelength of the electromagnetic waves, in a grid shape. The resonator 101 and the resonator 102 have different resonance frequencies. For example, when the resonance frequency of the resonator 101 is 60 MHz, the resonance frequency of the resonator 102 may be set to, e.g., 62.4 MHz, that is separated therefrom by 4% or more. In the third embodiment, when the ring member 111 for the resonator 101 and the ring member 111 for the resonator 102 are distinguished, the ring member for the resonator 101 is referred to as "ring member 111*a*" and the ring member for the resonator 102 is referred to as "ring member 111*b*."

In the resonator array structure 100*b*, as shown in FIG. 13, for example, the resonators 101 and 102 are arranged in 8 rows and 8 columns. In this case, the resonators 102 are arranged in an inner region 102*a* (4 rows and 4 columns at the center). On the other hand, the resonators 101 are arranged at the outer side of the region 102*a*. In other words, in the resonator array structure 100*b*, the resonators 101 and 102 having different resonance frequencies are arranged at the central portion and at the outer peripheral portion. For example, in an XIV-XIV cross section, the cross section of the resonators 102 is illustrated at the central portion, and the cross section of the resonators 101 is illustrated at the outer peripheral portion.

Similarly to the first embodiment, the plurality of resonators 101 and 102 are arranged in a direction along the bottom surface 20*a* of the dielectric window 20 (a direction along the plane parallel to the bottom surface 20*a*) in the flat resonator array structure 100*b*. In other words, when viewed from the bottom surface 20*a* side, the ring members 111*a* and 111*b* are arranged in a grid shape so that the C shape C can be seen. In this case, the boundaries between the plurality of resonators 101 and 102 are shown as the boundaries 105. However, actually, the plurality of resonators 101 and 102 are integrally formed as the resonator array structure 100*b*. Further, the gas inlet 13*c* is disposed at the center of the resonator array structure 100*b*, similarly to the first embodiment. Moreover, the magnetic field generated by the antenna 30 penetrates through the ring members 111*a* and 111*b*. As described above, the resonators 101 and 102 have different resonance frequencies between the outside and the inside of the resonator array structure 100*b* (the outer peripheral side and the central side of the resonators 101 and 102 arranged in a grid shape), so that the plasma distribution in the processing space S can be changed between the outside and the inside.

Modifications 5 to 7

Figure 14:
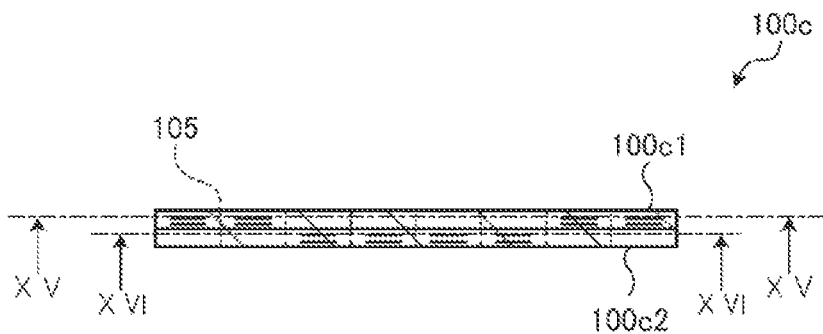
FIG. 14 is a cross-sectional view showing an example of a resonator array structure according to Modification 5.
Figure 15:
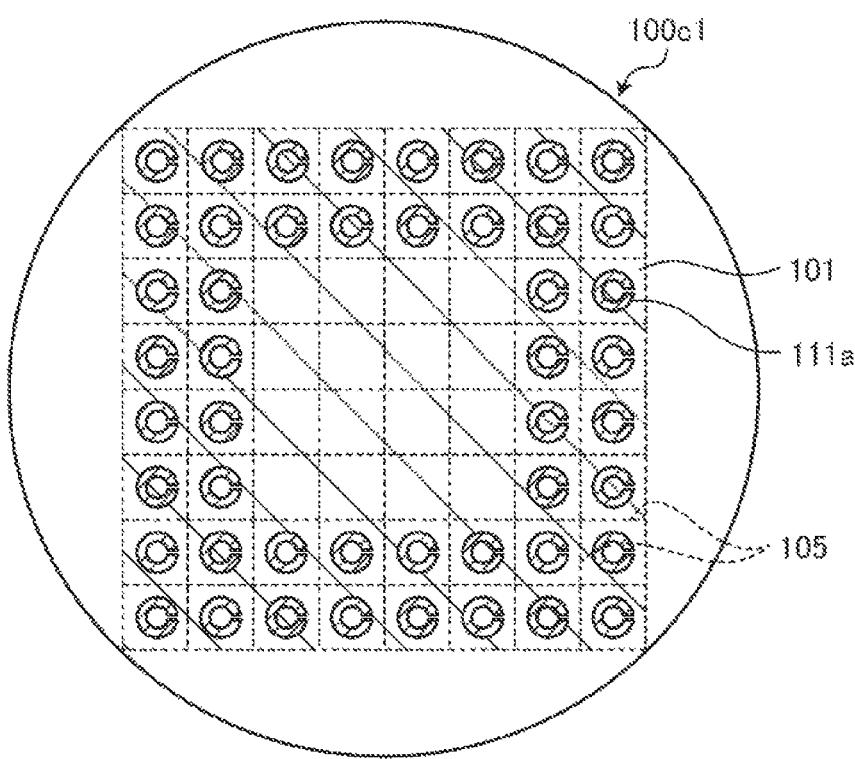
FIG. 15 is a cross-sectional view showing an example of the resonator array structure according to Modification 5.
Figure 16:
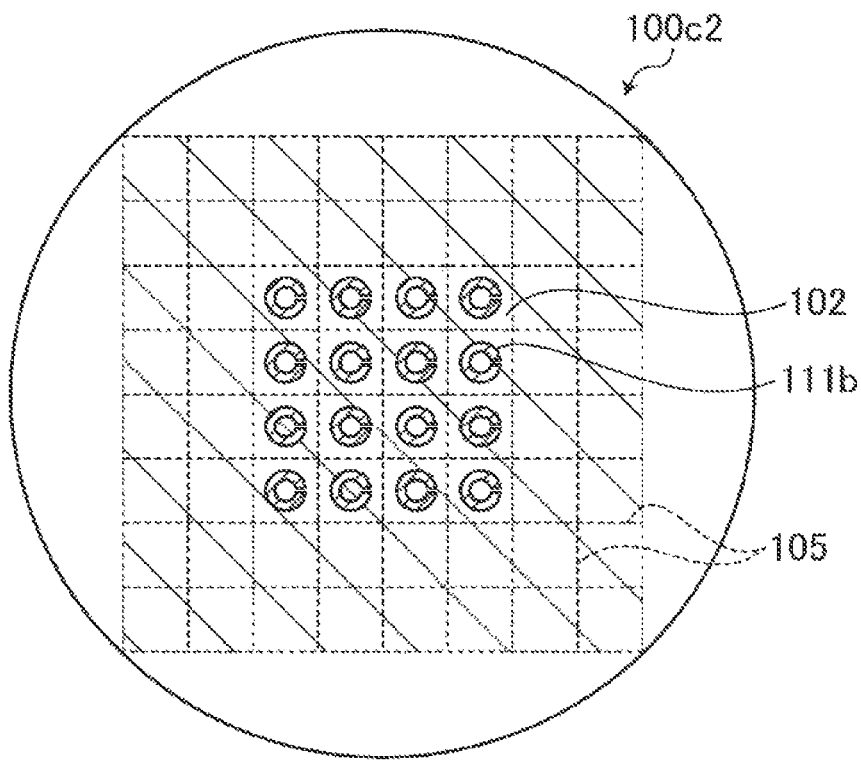
FIG. 16 is a cross-sectional view showing an example of the resonator array structure according to Modification 5.

Next, Modifications 5 to 7 of the third embodiment will be described using FIGS. 14 to 21. In the third embodiment, the resonators 101 and 102 having different resonance frequencies are arranged in one layer of the resonator array structure 100*b*. However, the resonator array structure may have a structure having multiple layers. FIGS. 14 to 16 are cross-sectional views showing an example of a resonator array structure according to Modification 5. The resonator array structure 100*c* shown in FIG. 14 has a first layer 100*c*1 and a second layer 100*c*2. For example, the cross section of the resonator array structure 100*c* at a position corresponding to the XIV-XIV cross section of the resonator array structure 100*b* in FIG. 13 is illustrated as the resonator array structure 100*c* in FIG. 14. In the cross section of the resonator array structure 100*c*, the cross section of the resonator 101 is illustrated in the first layer 100*c*1 and at the outer peripheral portion, and the cross section of the resonator 102 is illustrated in the second layer 100*c*2 and at the central portion. FIGS. 15 and 16 show an XV-XV cross section and an XVI-XVI cross section of the resonator array structure 100*c*, respectively. The resonator 101 disposed in the first layer 100*c*1 is illustrated in the XV-XV cross section, and the resonator 102 disposed in the second layer 100*c*2 is illustrated in the XVI-XVI cross section.

Among the resonators arranged in 8 rows and 8 columns, for example, the resonators 101 arranged in 2 rows and 2 columns of the outer peripheral portion (portion surrounding 4 rows and 4 columns of the second layer 100*c*2 to be described later) are arranged in the first layer 100*c*1. The resonators 101 includes the ring members 111*a*. The resonators 101 disposed in the first layer 100*c*1 correspond to the resonators 101 disposed outside the region 102*a* in the resonator array structure 100*b* of the third embodiment.

Among the resonators arranged in 8 rows and 8 columns, for example, the resonators 102 arranged in 4 rows and 4 columns of the central portion are arranged in the second layer 100*c*2. The resonators 102 includes the ring members 111*b*. The resonators 102 disposed in the second layer 100*c*2 correspond to the resonators 102 disposed inside the region 102*a* in the resonator array structure 100*b* of the third embodiment. In other words, the resonator array structure 100*c* has a structure in which the resonator array structure 100*b* of the third embodiment is separated into layers for the resonators 101 and 102. The plurality of resonators 101 and 102 arranged in the first layer 100*c*1 and the second layer 100*c*2 are arranged in a direction along the bottom surface 20*a* of the dielectric window 20 (a direction along the plane parallel to the bottom surface 20*a*). Further, the resonator array structure 100*c* may be formed by integrally molding the first layer 100*c*1 and the second layer 100*c*2, or may be integrated by molding them separately and then bonding them. Also in the resonator array structure 100*c*, the resonators 101 and 102 have different resonance frequencies between the outside and the inside, so that the plasma distribution in the processing space S can be changed between the outside and the inside.

Figure 17:
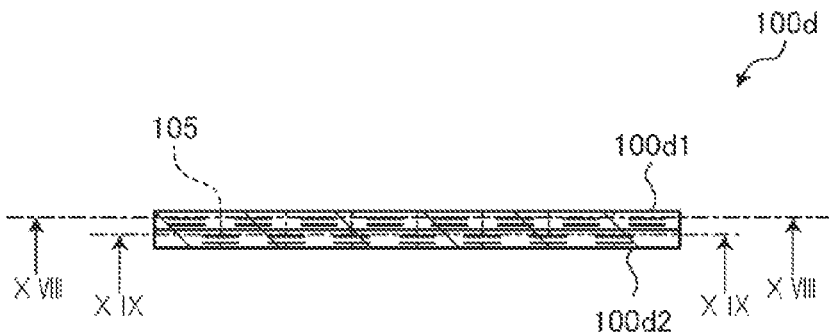
FIG. 17 is a cross-sectional view showing an example of a resonator array structure according to Modification 6.
Figure 18:
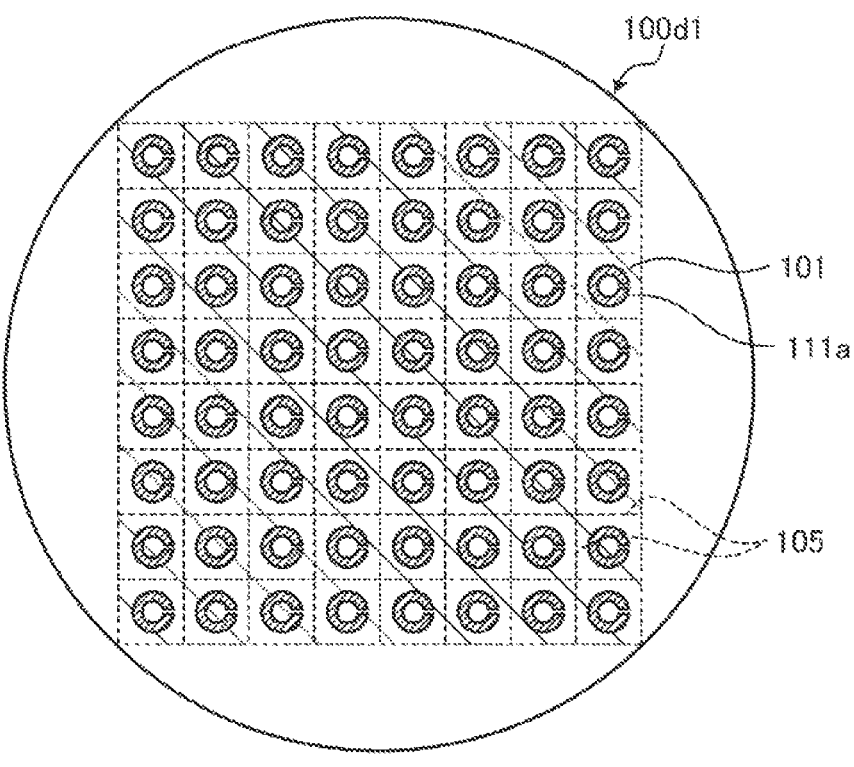
FIG. 18 is a cross-sectional view showing an example of the resonator array structure according to Modification 6.
Figure 19:
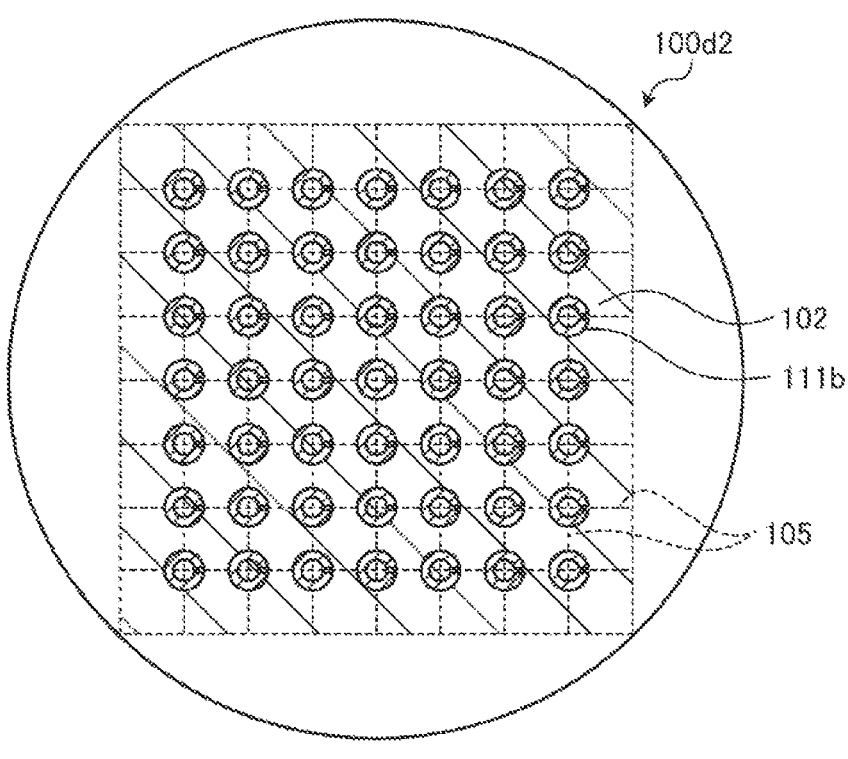
FIG. 19 is a cross-sectional view showing an example of the resonator array structure according to Modification 6.

FIGS. 17 to 19 are cross-sectional views showing an example of a resonator array structure according to Modification 6. A resonator array structure 100*d* shown in FIG. 17 has a first layer 100*d*1 and a second layer 100*d*2. For example, the cross section of the resonator array structure 100*d* at a position corresponding to the XIV-XIV cross section of the resonator array structure 100*b* in FIG. 13 is illustrated as the resonator array structure 100*d* in FIG. 17. In the cross section of the resonator array structure 100*d*, the cross section of the resonator 101 is illustrated in the first layer 100*d*1, and the cross section of the resonator 102 is illustrated in the second layer 100*d*2. FIGS. 18 and 19 show a XVIII-XVIII cross section and an XIX-XIX cross section in the cross section of the resonator array structure 100*d*, respectively. The resonator 101 disposed in the first layer 100*d*1 is illustrated in the XVIII-XVIII cross section, and the resonator 102 disposed in the second layer 100*d*2 is illustrated in the XIX-XIX cross section.

For example, the resonators 101 arranged in 8 rows and 8 columns are arranged in the first layer 100*d*1. The resonators 101 include the ring members 111*a*. The resonators 101 arranged in the first layer 100*d*1 correspond to the resonators 101 in the resonator array structure 100 of the first embodiment.

For example, the resonators 102 arranged in 7 rows and 7 columns are arranged in the second layer 100*d*2. The resonators 102 include the ring members 111*b*. The resonators 102 in the second layer 100*d*2 are misaligned with the resonators 101 in the first layer 100*d*1 such that the centers of the ring members 111*b* are located at the intersections of the boundaries 105 of the first layer 100*d*1. In FIG. 19, the boundaries of the resonators 102 are omitted for simplicity of illustration. Further, the plurality of resonators 101 and 102 in the first layer 100*d*1 and the second layer 100*d*2 are arranged in a direction along the bottom surface 20*a* of the dielectric window 20 (a direction along the plane parallel to the bottom surface 20*a*). Further, the resonator array structure 100*d* may be formed by integrally molding the first layer 100*d*1 and the second layer 100*d*2, or may be integrated by molding them separately and then bonding them. As described above, in the resonator array structure 100*d*, the resonators 101 and 102 having different resonance frequencies are misaligned, so that the number of resonators 101 and 102 through which the magnetic field penetrates can be increased, and the controllability of the plasma distribution or the plasma density can be improved.

Figure 20:
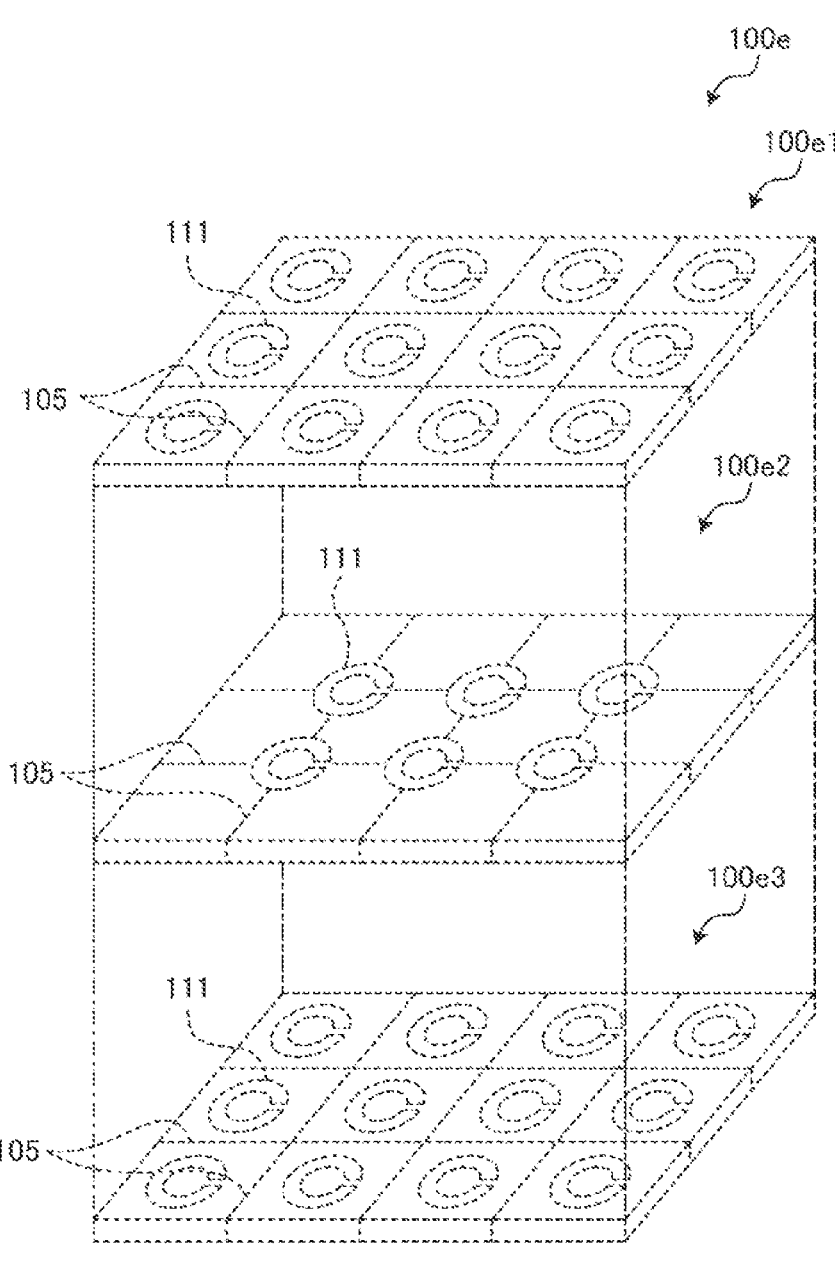
FIG. 20 is a cross-sectional view showing an example of a layer structure of a resonator array structure according to Modification 7.
Figure 21:
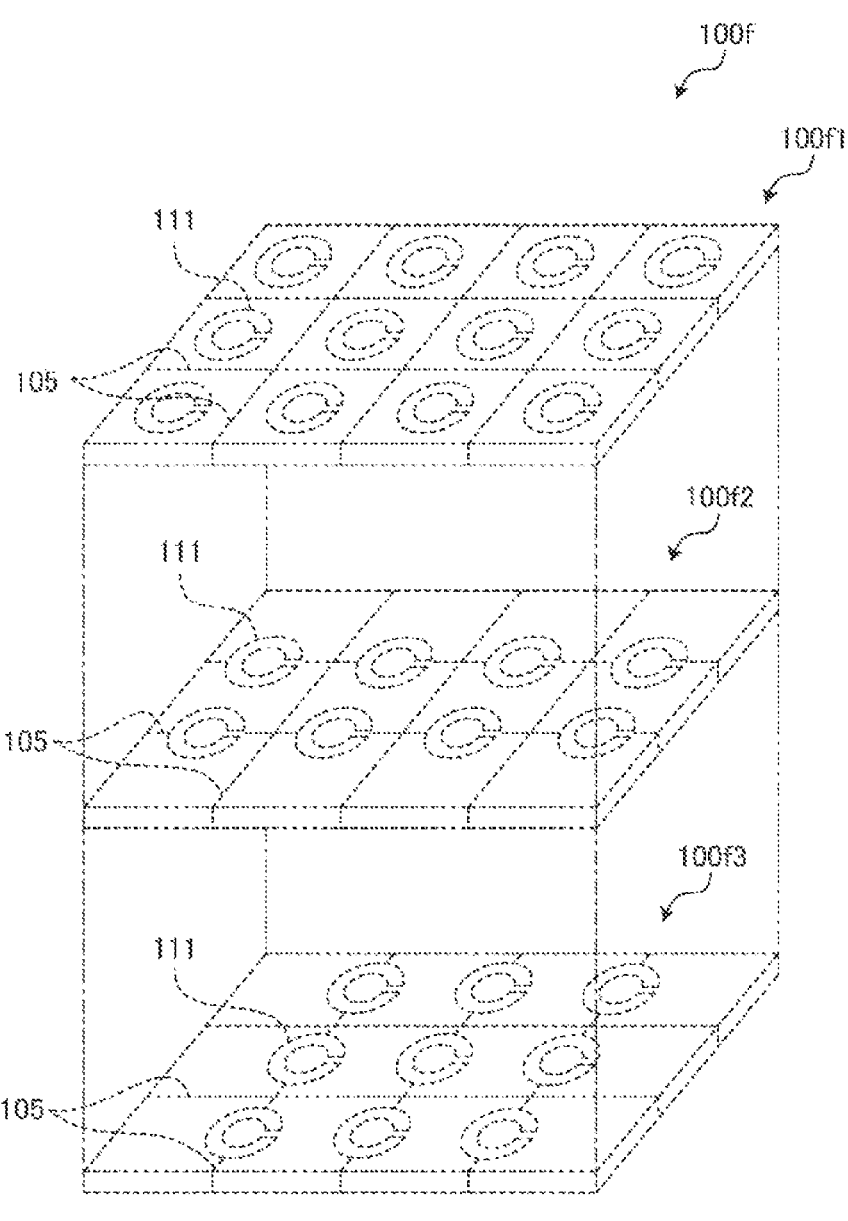
FIG. 21 is a cross-sectional view showing an example of the layer structure of the resonator array structure according to Modification 7.

FIGS. 20 and 21 show an example of a layer structure of a resonator array structure according to Modification 7. In modification 7 shown in FIGS. 20 and 21, a resonator array structure 100*e* and a resonator array structure 100*f* are illustrated as arrangement examples of resonators in the resonator array structure having three or more layers. In FIGS. 20 and 21, a part of the resonator array structure where the resonators are arranged is extracted.

The resonator array structure 100*e* has a first layer 100*e*1, a second layer 100*e*2, and a third layer 100*e*3. The first layer 100*e*1 has the same arrangement as the first layer 100*d*1 of Modification 6, and the ring members 111 are arranged inside the regions (i.e., the resonators 101) partitioned by the boundaries 105. The second layer 100*e*2 has the same arrangement as the second layer 100*d*2 of Modification 6, and the ring members 111 are arranged such that the centers thereof are located at the intersections of the boundaries 105. Although not shown, also in the second layer 100*e*2, the regions including the ring members 111 form the resonators 101. The third layer 100*e*3 has the same arrangement as the first layer 100*e*1, and the ring members 111 are arranged inside the regions (i.e., the resonators 101) partitioned by the boundaries 105. In FIG. 20, the boundaries of the resonators 101 of the second layer 100*e*2 are omitted for simplicity of illustration.

The resonator array structure 100*f* has a first layer 100*f*1, a second layer 100*f*2, and a third layer 100*f*3. The first layer 100*f*1 has the same arrangement as the first layer 100*e*1 of the resonator array structure 100*e*, and the ring members 111 are arranged inside the regions (i.e., the resonators 101) partitioned by the boundaries 105. The second layer 100*f*2 is misaligned with the first layer 100*f*1 by a half row such that the centers of the ring members 111 are located on the horizontal boundaries 105 in FIG. 21. The third layer 100*f*3 is misaligned with the first layer 100*f*1 by a half column such that the centers of the ring members 111 are located on the vertical boundaries 105 in FIG. 21. Although not shown, also in the second layer 100*f*2 and the third layer 100*f*3, the regions including the ring members 111 form the resonators 101.

Further, when the resonator array structures 100*c* to 100*f* of the third embodiment and Modifications 5 to 7 have a multiple layer structure as illustrated, the arrangement of the resonators 101 and 102 in different layers may be different or may be the same. Further, the resonators 101 and 102 may have the same frequency for each layer, or may have different frequencies for each layer. Further, the resonators 101 and 102 may have the same resonance frequency in each layer, or may have different resonance frequencies in each layer. In other words, the resonance frequencies of the resonators 101 and 102 in each layer and the arrangement of the resonators in each layer may be freely combined.

Fourth Embodiment

Although through-holes are not provided in the vertical direction of the resonator array structure 100 in the above-described first embodiment, through-holes may be provided in the resonator array structure. An embodiment in that case will be described as a fourth embodiment. A plasma processing apparatus according to the fourth embodiment is the same as that of the first embodiment except the structure of the resonator array structure 100, so that the description of redundant configurations and operations will be omitted.

Figure 22:
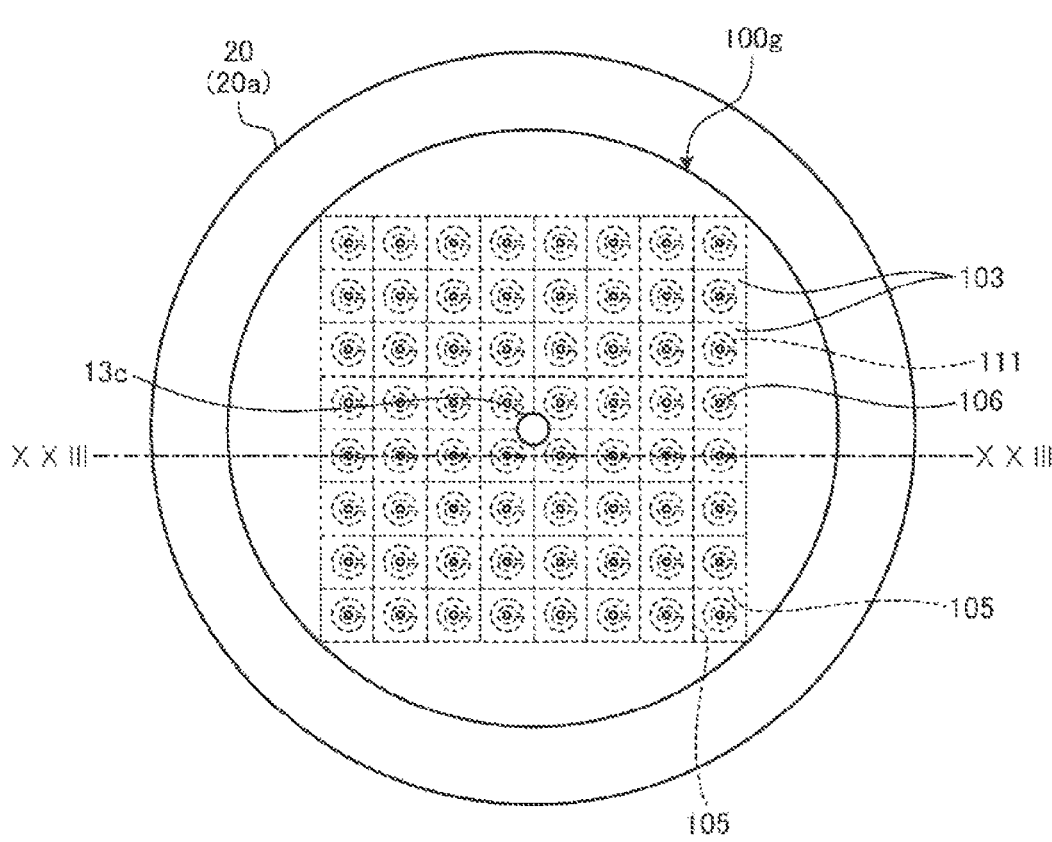
FIG. 22 is a bottom plan view showing an example of a configuration of a dielectric window and a resonator array structure according to a fourth embodiment.

FIG. 22 is a bottom plan view showing an example of a configuration of a dielectric window and a resonator array structure according to the fourth embodiment. As shown in FIG. 22, the fourth embodiment includes a resonator array structure 100*g* instead of the resonator array structure 100 of the first embodiment. As shown in FIG. 22, the resonator array structure 100*g* is formed by arranging the plurality of resonators 103, which can resonate with the magnetic field components of the electromagnetic waves and have a size smaller than the wavelength of the electromagnetic waves, in a grid shape. In the resonator array structure 100*g*, the resonators 103 are arranged in 8 rows and 8 columns as shown in FIG. 22, for example.

Similarly to the first embodiment, the plurality of resonators 103 are arranged along the bottom surface 20*a* of the dielectric window 20 (along the plane parallel to the bottom surface 20*a*) in the flat resonator array structure 100*g*. In other words, when viewed from the bottom surface 20*a* side, the transparent C-shaped ring members 111 are arranged in a grid pattern so that the C-shape can be seen. In other words, when viewed from the bottom surface 20*a* side, the C-shaped ring members 111 are arranged in a grid shape so that the C shape C can be seen. In this case, the boundaries between the plurality of resonators 103 are shown as the boundaries 105. However, actually, the plurality of resonators 103 are integrally formed as the resonator array structure 100g. Further, the gas inlet 13c is disposed at the center of the resonator array structure 100g, similarly to the first embodiment.

Figure 23:
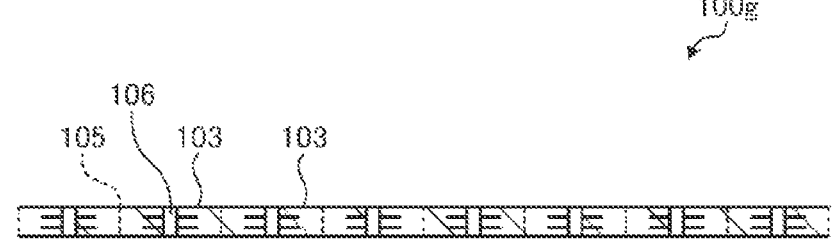
FIG. 23 is a cross-sectional view showing an example of an XXIII-XXIII cross section of FIG. 22.

FIG. 23 is a cross-sectional view showing an example of an XXIII-XXIII cross section of FIG. 22. As shown in FIG. 23, in the XXIII-XXIII cross section of the resonator array structure 100g, the cross sections of the plurality of resonators 103 are illustrated side by side. Further, each resonator 103 has a through-hole 106 at the center thereof. Similarly to FIG. 22, the boundaries between the plurality of resonators 103 are illustrated as the boundaries 105.

Figure 24:
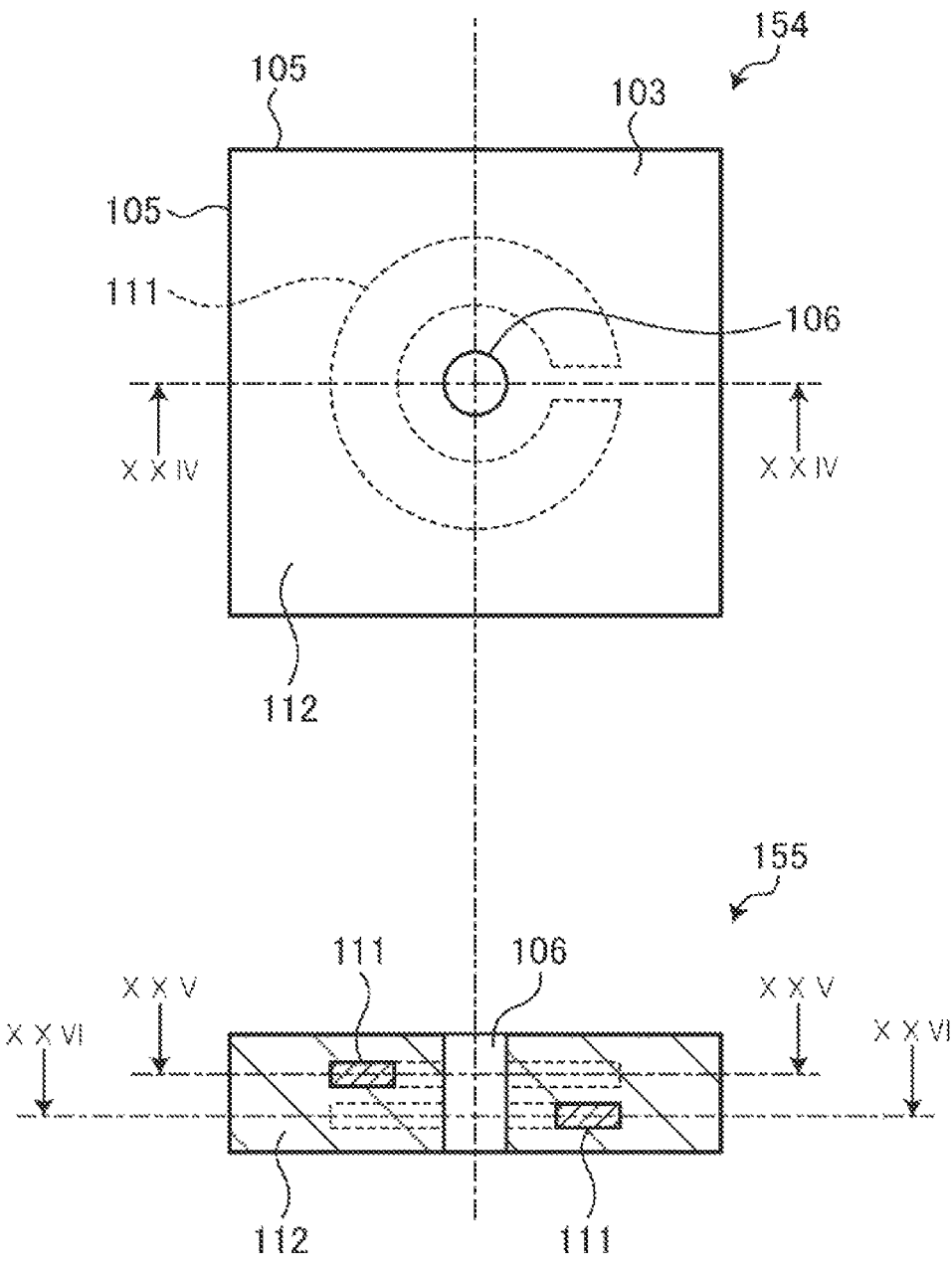
FIG. 24 is a cross-sectional view showing an example of a plane and a XXIV-XXIV cross section of a single resonator according to the fourth embodiment.

FIG. 24 show an example of a plane and a XXIV-XXIV cross section of a single resonator according to the fourth embodiment. FIG. 24 shows a plan view 154 of a single resonator 103 and a cross-sectional view 155 taken along the XXIV-XXIV cross section of the plan view 154 among the plurality of resonators 103 that are formed integrally. As shown in the plan view 154 and the cross-sectional view 155, the single resonator 103 is disposed inside a region surrounded by the boundaries 105. In other words, in the present embodiment, in the resonator 103, two C-shaped ring members 111 are surrounded by the dielectric 112. Further, the through-hole 106 passing through the dielectric 112 is formed in the centers of the two C-shaped ring members 111. In other words, the through-holes 106 penetrate through the upper surface and the bottom surface of the resonator array structure 100g.

Figure 25:
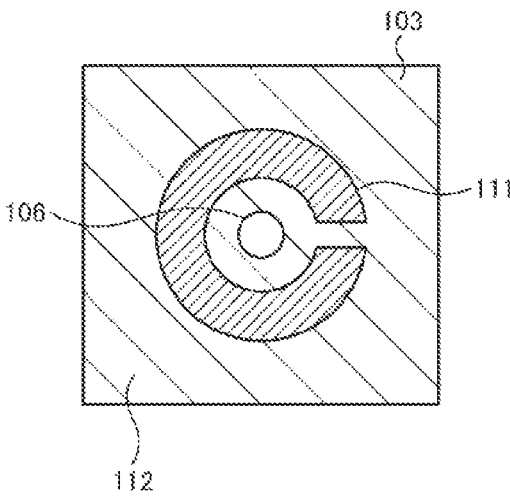
FIG. 25 is a cross-sectional view showing an example of a XXV-XXV cross section of FIG. 24.
Figure 26:
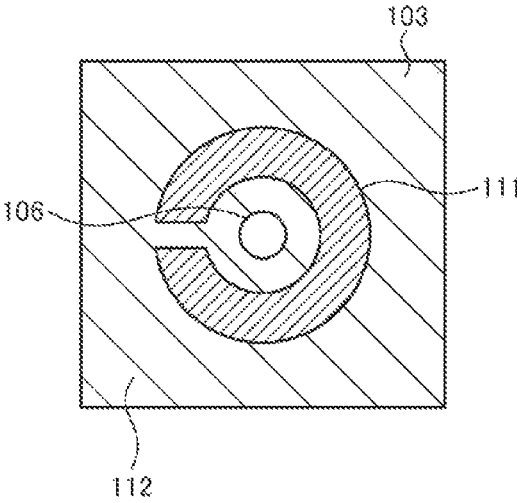
FIG. 26 is a cross-sectional view showing an example of an XXVI-XXVI cross section of FIG. 24.

FIG. 25 is a cross sectional view showing an example of a XXV-XXV section of FIG. 24. FIG. 26 is a cross-sectional view showing an example of an XXVI-XXVI cross section of FIG. 24. As shown in the cross-sectional view 155 of FIG. 24, and FIGS. 25, and 26, the single resonator 103 has a structure in which the dielectric 112 is embedded between two C-shaped ring members 111 made of a conductor and adjacent to each other in opposite directions. In other words, in the resonator 103, the dielectric 112 is embedded between the two C-shaped ring members 111 arranged in the opposite directions. In this case, the through-hole 106 has a diameter that allows the dielectric 112 to be disposed between the two C-shaped ring members 111. In other words, the two C-shaped ring members 111 are not exposed to the through-hole 106. Similarly to the resonator 101 of the first embodiment, in the resonator 103, a capacitor equivalent element is formed on the opposing surfaces of two C-shaped ring members 111 or at both ends of each ring member 111, and a coil equivalent element is formed along each ring member 111. Accordingly, the resonator 103 can configure a series resonant circuit. The number of lamination of the C-shaped ring members 111 in the resonator 103 may be greater than two, similarly to the resonator 101 of the first embodiment. Further, similarly to the apparatus main body 10a of the second embodiment, the resonator array structure 100g may be fixed to the sidewall 12a of the processing chamber 12 via the support member 19, and may be spaced apart from the bottom surface 20a of the dielectric window 20. In this case, in the processing space S, the processing gas can more freely pass through the upper side and the lower side of the resonator array structure 100g. The through-hole 106 is not necessarily formed at the center of the ring member 111 as long as it does not overlap with the ring members 111.

Although the electromagnetic waves in the VHF band have been described as an example of the electromagnetic waves supplied to the processing space S in the processing chamber 12 in the above embodiments, the electromagnetic waves may have a lower frequency. The frequency of the electromagnetic waves may be lowered (e.g., 13 MHz) to supply electromagnetic waves in a region where propagation of waves is hardly observed to the processing space S in the processing chamber 12. In this case, the electromagnetic field radiated from the antenna 30 or the like hardly exhibits wave characteristics, but the magnetic field components thereof can cause resonance by the coil component of the resonator 101 or the like. Such behavior is discussed in a category referred to as a high frequency circuit or a distributed constant circuit. In other words, the resonator 101 or the like can resonate even with electromagnetic waves whose converted wavelength is longer by single digit or more than the device dimensions (the dimensions of the processing chamber 12) and whose wave characteristics do not exhibit. In other words, the high-density plasma can be realized over a wide range even when the wavelength of the electromagnetic waves supplied to the processing space S in the processing chamber 12 is longer by single digit or more than the dimensions of the processing chamber 12 and can be considered as a high frequency within a range treated as a distributed constant circuit.

As described above, in accordance with the embodiments, the plasma processing apparatus 1 includes the processing chamber 12 having the processing space S, the electromagnetic wave generator (the RF power supply 16) configured to generate electromagnetic waves for plasma excitation to be supplied to the processing space S, the dielectric (the dielectric window 20) having the first surface facing the processing space, the electromagnetic wave supply (the antennas 30 to 33) configured to supply electromagnetic waves to the processing space S via the dielectric, and the resonator array structure (the resonator array structures 100, 100a to 100g) disposed along the first surface of the dielectric in the processing chamber 12. The resonator array structure includes the plurality of resonators (the resonators 101 to 103) that can resonate with the magnetic field components of the electromagnetic waves, have a size smaller than the wavelength of the electromagnetic waves, and are arranged along the first surface of the dielectric. The electromagnetic wave supply supplies the magnetic field components perpendicular to the plane on which the plurality of resonators are arranged. As a result, the high-density plasma can be realized over a wide range, and the structure of the resonator array structure can be simplified.

Further, in accordance with the embodiments, the resonator array structure is parallel to the first surface of the dielectric, and the plurality of resonators are arranged along the plane parallel to the first surface of the dielectric. As a result, the resonators arranged in the horizontal direction can resonate.

Further, in accordance with the embodiments, the electromagnetic wave supply is a coil provided outside the processing chamber 12. As a result, the resonators arranged in the horizontal direction can resonate.

Further, in accordance with the embodiments, the coil is disposed such that the opening of the coil is parallel to the resonator array structure. As a result, the resonators arranged in the horizontal direction can resonate.

Further, in accordance with the embodiments, the coil is wound in a loop shape. As a result, the magnetic field can be supplied to the horizontally arranged resonators.

Further, in accordance with the second embodiment, the coil is wound in a solenoid shape. As a result, stronger magnetic field can be supplied.

Further, in accordance with Modifications 3 and 4, the coil has a core (the cores 32a and 33a) made of a high magnetic permeability material. As a result, stronger magnetic field can be supplied.

Further, in accordance with the first embodiment, the coil is wound in a planar spiral shape. As a result, the magnetic field can be supplied to the horizontally arranged resonators.

Further, in accordance with Modification 4, the plurality of coils are provided. As a result, stronger magnetic field can be supplied.

Further, in accordance with the first, third, and fourth embodiments and Modifications 1 to 4, the resonator array structure is disposed to be in contact with the first surface of the dielectric. As a result, the high-density plasma can be realized over a wide range, and the structure of the resonator array structure can be simplified.

In accordance with the second embodiment, the resonator array structure 100 is provided in the processing space S so to be spaced apart from the first surface of the dielectric. As a result, plasma can be generated at a position closer to the object to be processed.

In accordance with Modification 2, the resonator array structure 100a is disposed to be integrated with the dielectric. As a result, the structure of the resonator array structure can be further simplified.

Further, in accordance with the third embodiment, the plurality of resonators include two or more resonators having different resonance frequencies. As a result, the plasma distribution in the processing space S can be changed.

Further, in accordance with the third embodiment, the plurality of resonators are arranged in a grid shape, and have different resonance frequencies between the central portion and the outer peripheral portion of the grid-shaped arrangement. As a result, the plasma distribution in the processing space S can be changed between the outside and the inside.

Further, in accordance with Modification 5, the resonator array structure 100c has a multiple layer structure, and the plurality of resonators are arranged in different layers between the central portion and the outer peripheral portion. As a result, the plasma distribution in the processing space S can be changed between the outside and the inside.

In accordance with Modifications 5 to 7, the resonator array structure has a multiple layer structure, and the plurality of resonators are arranged for each layer. As a result, the plasma distribution in the processing space S can be changed.

Further, in accordance with Modifications 5 to 7, the plurality of resonators are arranged differently for each layer. As a result, the plasma distribution in the processing space S can be changed.

Further, in accordance with Modification 7, the plurality of resonators have the same resonance frequency for each layer. As a result, the plasma distribution in the processing space S can be changed.

Further, in accordance with Modification 7, the plurality of resonators have different resonance frequencies for each layer. As a result, the plasma distribution in the processing space S can be changed.

Further, in accordance with the fourth embodiment, the resonator array structure 100g has the through-holes 106 penetrating through the upper surface and the bottom surface. As a result, in the processing space S, the processing gas can more freely pass through the upper side and the lower side of the resonator array structure 100g.

Further, in accordance with the embodiments, the wavelength of the electromagnetic waves is longer by single digit or more than the dimensions of the processing chamber 12 and can be considered as a high frequency within the range treated as a distributed constant circuit. As a result, the resonator can resonate even with electromagnetic waves whose wavelength does not exhibit wave characteristics.

It should be noted that the embodiments of the present disclosure illustrative in all respects and are not restrictive. The above-described embodiments may be omitted, replaced, or changed in various forms without departing from the scope of the appended claims and the gist thereof.

In the above embodiments, the resonator array structures 100, and 100a to 100g are embedded in the dielectric window 20b disposed along the bottom surface 20a of the dielectric window 20, or is spaced apart from the bottom surface 20a of the dielectric window 20. However, the present disclosure is not limited thereto, and the resonator array structures 100, and 100a to 100g may be arranged along the upper surface of the electrostatic chuck 14c that faces the processing space S, or may be spaced apart from the upper surface of the electrostatic chuck 14c. Further, the resonator array structures 100, and 100a to 100g may be arranged along the inner wall surface of the sidewall 12a of the processing chamber 12, or may be spaced apart from the inner wall surface of the sidewall 12a of the processing chamber 12. In summary, the resonator array structures 100, and 100a to 100g may be arranged along the first surface of the member having one surface (first surface) facing the processing space S, or may be spaced apart from the first surface of the corresponding member.

Further, in the above embodiments, the output part of the RF power supply 16 may be connected to the base 14a that is a high frequency electrode. In this case, the base 14a supplies electromagnetic waves outputted from the RF power supply 16 to the processing space S via the electrostatic chuck 14c. In this configuration, the resonator array structures 100, and 100a to 100g may be embedded in the electrostatic chuck 14c.

In the above embodiments, in the resonator array structures 100, and 100a to 100g, the plurality of resonators 101 to 103 capable of resonating with the magnetic field components of electromagnetic waves and have a size smaller than the wavelength of the electromagnetic waves are arranged in a grid shaped along the first surface of the dielectric. However, the present disclosure is not limited thereto, and the plurality of resonators 101 to 103 may have any arrangement as long as they are arranged along the first surface of the dielectric. For example, the plurality of resonators 101 to 103 may be arranged at predetermined intervals along one direction.

Further, in the above embodiments, an inductively coupled coil is used as an antenna for inputting electromagnetic waves. However, the present disclosure is not limited thereto as long as the magnetic field can be generated in a direction penetrating through the ring members 111 of the plurality of resonators 101 to 103 of the resonator array structures 100, and 100a to 100g. The antenna for inputting electromagnetic waves is not limited to an inductively coupled coil, and any antenna or any mechanism for inputting any electromagnetic waves, such as a slot antenna, a monopole antenna, a capacitively coupled electrode, a magnetron, or the like, can be used.

Further, the present disclosure may employ the following configurations.

(1)

A plasma processing apparatus comprising:

a processing chamber having a processing space;

an electromagnetic wave generator configured to generate electromagnetic waves for plasma excitation to be supplied to the processing space;

a dielectric having a first surface facing the processing space;

an electromagnetic wave supply configured to supply the electromagnetic waves to the processing space via the dielectric; and a resonator array structure disposed along the first surface of the dielectric in the processing chamber, wherein the resonator array structure includes a plurality of resonators resonating with magnetic field components of the electromagnetic waves, having a size smaller than a wavelength of the electromagnetic waves, and arranged in a direction along the first surface of the dielectric, and the electromagnetic wave supply is configured to supply magnetic field components perpendicular to a plane on which the plurality of resonators are arranged.

(2)

The plasma processing apparatus of (1), wherein the resonator array structure is parallel to the first surface of the dielectric, and the plurality of resonators are arranged in a direction along a plane parallel to the first surface of the dielectric.

(3)

The plasma processing apparatus of (1) or (2), wherein the electromagnetic wave supply is a coil disposed outside the processing chamber.

(4)

The plasma processing apparatus of (3), wherein the coil is disposed such that an opening of the coil is parallel to the resonator array structure.

(5)

The plasma processing apparatus of (3) or (4), wherein the coil is wound in a loop shape.

(6)

The plasma processing apparatus of (5), wherein the coil is wound in a solenoid shape.

(7)

The plasma processing apparatus of (6), wherein the coil has a core made of a high magnetic permeability material.

(8)

The plasma processing apparatus of (5), wherein the coil is wound in a planar spiral shape.

(9)

The plasma processing apparatus of any one of (3) to (8), wherein a plurality of the coils are provided.

(10)

The plasma processing apparatus of any one of (1) to (9), wherein the resonator array structure is disposed to be in contact with the first surface of the dielectric.

(11)

The plasma processing apparatus of any one of (1) to (9), wherein the resonator array structure is disposed in the processing space to be spaced apart from the first surface of the dielectric.

(12)

The plasma processing apparatus of any one of (1) to (9), wherein the resonator array structure is disposed to be integrated with the dielectric.

(13)

The plasma processing apparatus of any one of (1) to (12), wherein the plurality of resonators include two or more resonators having different resonance frequencies.

(14)

The plasma processing apparatus of (13), wherein the plurality of resonators are arranged in a grid shape, and the resonance frequency is different between a central portion and an outer peripheral portion of the grid-shaped arrangement.

(15)

The plasma processing apparatus of (14), wherein the resonator array structure has a multiple layer structure, and the plurality of resonators are arranged in different layers between the central portion and the outer peripheral portion.

(16)

The plasma processing apparatus of any one of (1) to (14), wherein the resonator array structure has a multiple layer structure, and the plurality of resonators are arranged for each layer.

(17)

The plasma processing apparatus of (16), wherein the plurality of resonators are arranged differently for each layer.

(18)

The plasma processing apparatus of (16) or (17), wherein the plurality of resonators have the same resonance frequency for each layer.

(19)

The plasma processing apparatus of (16) or (17), wherein the plurality of resonators have different resonance frequencies for each layer.

(20)

The plasma processing apparatus of (10) or (11), wherein the resonator array structure has a through-hole penetrating through an upper surface and a bottom surface.

(21)

The plasma processing apparatus of any one of (1) to (20), wherein the wavelength of the electromagnetic waves is longer by single digit or more than dimensions of the processing chamber and considered as a high frequency in a range treated as a distributed constant circuit.

The invention claimed is:

1. A plasma processing apparatus comprising:

a processing chamber having a processing space;

an electromagnetic wave generator configured to generate electromagnetic waves for plasma excitation to be supplied to the processing space;

a dielectric having a first surface facing the processing space;

an electromagnetic wave supply connected to an RF power supply and configured to supply the electromagnetic waves to the processing space via the dielectric; and a resonator array structure disposed along the first surface of the dielectric in the processing chamber, wherein the resonator array structure includes a plurality of resonators resonating with magnetic field components of the electromagnetic waves, having a size smaller than a wavelength of the electromagnetic waves, and arranged in a direction along the first surface of the dielectric, the electromagnetic wave supply is configured to supply magnetic field components perpendicular to a plane on which the plurality of resonators are arranged, and the electromagnetic wave supply is a coil disposed outside the processing chamber and wound in a planar spiral shape.

2. The plasma processing apparatus of claim 1, wherein the resonator array structure is parallel to the first surface of the dielectric, and the plurality of resonators are arranged in a direction along a plane parallel to the first surface of the dielectric.

3. The plasma processing apparatus of claim 1, wherein the coil is disposed such that an opening of the coil is parallel to the resonator array structure.

4. The plasma processing apparatus of claim 1, wherein a plurality of the coils are provided.

5. The plasma processing apparatus of claim 1, wherein the resonator array structure is disposed to be in contact with the first surface of the dielectric.

6. The plasma processing apparatus of claim 5, wherein the resonator array structure has a through-hole penetrating through an upper surface and a bottom surface.

7. The plasma processing apparatus of claim 1, wherein the resonator array structure is disposed in the processing space to be spaced apart from the first surface of the dielectric.

8. The plasma processing apparatus of claim 1, wherein the resonator array structure is disposed to be integrated with the dielectric.

9. The plasma processing apparatus of claim 1, wherein the plurality of resonators include two or more resonators having different resonance frequencies.

10. The plasma processing apparatus of claim 9, wherein the plurality of resonators are arranged in a grid shape, and the resonance frequency is different between a central portion and an outer peripheral portion of the grid-shaped arrangement.

11. The plasma processing apparatus of claim 10, wherein the resonator array structure has a multiple layer structure, and the plurality of resonators are arranged in different layers between the central portion and the outer peripheral portion.

12. The plasma processing apparatus of claim 1, wherein the resonator array structure has a multiple layer structure, and the plurality of resonators are arranged for each layer.

13. The plasma processing apparatus of claim 12, wherein the plurality of resonators are arranged differently for each layer.

14. The plasma processing apparatus of claim 12, wherein the plurality of resonators have the same resonance frequency for each layer.

15. The plasma processing apparatus of claim 12, wherein the plurality of resonators have different resonance frequencies for each layer.

16. The plasma processing apparatus of claim 1, wherein the wavelength of the electromagnetic waves is longer by single digit or more than dimensions of the processing chamber and considered as a high frequency in a range treated as a distributed constant circuit.

17. A plasma processing apparatus comprising:
   a processing chamber having a processing space;
   an electromagnetic wave generator configured to generate electromagnetic waves for plasma excitation to be supplied to the processing space;
   a dielectric having a first surface facing the processing space;
   an electromagnetic wave supply connected to an RF power supply and configured to supply the electromagnetic waves to the processing space via the dielectric; and
   a resonator array structure disposed along the first surface of the dielectric in the processing chamber,
   wherein the resonator array structure includes a plurality of resonators resonating with magnetic field components of the electromagnetic waves, having a size smaller than a wavelength of the electromagnetic waves, and arranged in a direction along the first surface of the dielectric,
   the electromagnetic wave supply is configured to supply magnetic field components perpendicular to a plane on which the plurality of resonators are arranged, and
   the electromagnetic wave supply is a coil disposed outside the processing chamber and wound in a solenoid shape.

18. The plasma processing apparatus of claim 17, wherein the coil has a core made of a high magnetic permeability material.

* * * * *